(12) United States Patent
Morris et al.

(10) Patent No.: US 11,608,696 B2
(45) Date of Patent: Mar. 21, 2023

(54) ELECTRIC POWER DISTRIBUTION FOR FRACTURING OPERATION

(71) Applicant: Typhon Technology Solutions (U.S.), LLC, The Woodlands, TX (US)

(72) Inventors: Jeffrey G. Morris, The Woodlands, TX (US); Adrian Benjamin Bodishbaugh, Fayetteville, AR (US); Neal Jensen, Henderson, NV (US)

(73) Assignee: Typhon Technology Solutions (U.S.), LLC, The Woodlands, TX (US)

( * ) Notice: Subject to any disclaimer, the term of this patent is extended or adjusted under 35 U.S.C. 154(b) by 582 days.

(21) Appl. No.: 16/691,277

(22) Filed: Nov. 21, 2019

(65) Prior Publication Data
US 2020/0087997 A1    Mar. 19, 2020

Related U.S. Application Data

(63) Continuation of application No. 16/021,691, filed on Jun. 28, 2018, now Pat. No. 10,519,730.
(Continued)

(51) Int. Cl.
*E21B 43/26* (2006.01)
*E21B 21/06* (2006.01)
(Continued)

(52) U.S. Cl.
CPC ............ *E21B 21/062* (2013.01); *C09K 8/80* (2013.01); *E21B 41/0085* (2013.01); *E21B 43/26* (2013.01); *E21B 43/2607* (2020.05); *F01D 15/10* (2013.01); *F01L 15/10* (2013.01); *F04B 17/03* (2013.01); *H01R 13/00* (2013.01);
(Continued)

(58) Field of Classification Search
CPC ...................................................... E21B 43/26
See application file for complete search history.

(56) References Cited

U.S. PATENT DOCUMENTS 5,512,811 A    4/1996 Latos et al.
8,882,336 B1   11/2014 Wolford
(Continued)

FOREIGN PATENT DOCUMENTS

AR    092923 A1    5/2015
AR    104823 A2    8/2017
(Continued)

OTHER PUBLICATIONS

204US00 English translation of Office Action issued in the prosecution of application AR087298 B1 dated Dec. 29, 2017, 5 pages.
(Continued)

*Primary Examiner* — Kenneth L Thompson
(74) *Attorney, Agent, or Firm* — Fenwick & West LLP

(57) ABSTRACT

Providing electric power distribution for fracturing operations comprising receiving, at a transport, electric power from a mobile source of electricity at a first voltage level and supplying, from the transport, the electric power to a fracturing pump transport at the first voltage level using only a first, single cable connection. The first voltage level falls within a range of 1,000 V to 35 kilovolts. The transport also supplies electric power to a second transport at the first voltage level using only a second, single cable connection.

18 Claims, 10 Drawing Sheets

Related U.S. Application Data

(60) Provisional application No. 62/526,869, filed on Jun. 29, 2017.

(51) Int. Cl.

| | | |
|---|---|---|
| *F04B 17/03* | (2006.01) | |
| *C09K 8/80* | (2006.01) | |
| *F01L 15/10* | (2006.01) | |
| *H01R 13/00* | (2006.01) | |
| *H02K 11/04* | (2016.01) | |
| *H02M 7/00* | (2006.01) | |
| *H03K 17/00* | (2006.01) | |
| *E21B 41/00* | (2006.01) | |
| *F01D 15/10* | (2006.01) | |
| *H02K 7/18* | (2006.01) | |

(52) U.S. Cl.
CPC ......... *H02K 7/1823* (2013.01); *H02K 11/046* (2013.01); *H02M 7/00* (2013.01); *H03K 17/00* (2013.01)

(56) References Cited

U.S. PATENT DOCUMENTS

| | | | |
|---|---|---|---|
| 9,121,257 B2 | 9/2015 | Coli et al. | |
| 9,140,110 B2 | 9/2015 | Coli et al. | |
| 9,410,410 B2 | 8/2016 | Broussard et al. | |
| 9,452,394 B2 | 9/2016 | Weinstein et al. | |
| 9,475,020 B2 | 10/2016 | Coli et al. | |
| 9,475,021 B2 | 10/2016 | Coli et al. | |
| 9,534,473 B2* | 1/2017 | Morris | F01D 25/30 |
| 9,562,420 B2 | 2/2017 | Morris et al. | |
| 9,587,649 B2* | 3/2017 | Oehring | E21B 43/26 |
| 9,893,500 B2* | 2/2018 | Oehring | F04B 35/04 |
| 9,995,218 B2* | 6/2018 | Oehring | F02C 7/143 |
| 10,107,084 B2 | 10/2018 | Coli et al. | |
| 10,107,085 B2 | 10/2018 | Coli et al. | |
| 10,221,668 B2 | 3/2019 | Coli et al. | |
| 10,227,855 B2 | 3/2019 | Coli et al. | |
| 10,246,984 B2* | 4/2019 | Payne | E21B 43/2607 |
| 10,378,326 B2* | 8/2019 | Morris | E21B 43/26 |
| 10,407,990 B2* | 9/2019 | Oehring | E21B 7/02 |
| 10,519,730 B2* | 12/2019 | Morris | H02K 7/1823 |
| 10,794,166 B2* | 10/2020 | Reckels | E21B 43/26 |
| 10,947,829 B2* | 3/2021 | Oehring | F04B 23/04 |
| 11,181,107 B2* | 11/2021 | Oehring | H02J 3/38 |
| 11,449,018 B2* | 9/2022 | Oehring | H02J 3/14 |
| 2004/0104577 A1 | 6/2004 | Alger et al. | |
| 2007/0132243 A1 | 6/2007 | Wurtele et al. | |
| 2009/0308602 A1 | 12/2009 | Bruins et al. | |
| 2011/0175579 A1 | 7/2011 | Mazumdar | |
| 2013/0150268 A1 | 6/2013 | Oldham | |
| 2013/0306322 A1* | 11/2013 | Sanborn | E21B 43/2607 166/308.1 |
| 2014/0096974 A1 | 4/2014 | Coli et al. | |
| 2014/0238683 A1 | 8/2014 | Korach et al. | |
| 2014/0255214 A1 | 9/2014 | Burnette | |
| 2015/0036453 A1 | 2/2015 | Wolford | |
| 2015/0068724 A1 | 3/2015 | Coli et al. | |
| 2015/0114652 A1 | 4/2015 | Lestz et al. | |
| 2015/0300145 A1 | 10/2015 | Coli et al. | |
| 2015/0314255 A1 | 11/2015 | Coli et al. | |
| 2016/0177675 A1 | 6/2016 | Morris et al. | |
| 2016/0177678 A1 | 6/2016 | Morris et al. | |
| 2016/0208593 A1 | 7/2016 | Coli et al. | |
| 2016/0208594 A1 | 7/2016 | Coli et al. | |
| 2016/0273328 A1 | 9/2016 | Oehring | |
| 2016/0326855 A1 | 11/2016 | Coli et al. | |
| 2016/0348479 A1 | 12/2016 | Oehring et al. | |
| 2016/0369609 A1 | 12/2016 | Morris et al. | |
| 2017/0028368 A1 | 2/2017 | Oehring et al. | |
| 2017/0036178 A1 | 2/2017 | Coli et al. | |
| 2017/0037718 A1 | 2/2017 | Coli et al. | |
| 2017/0104389 A1 | 4/2017 | Morris et al. | |
| 2017/0218843 A1 | 8/2017 | Oehring et al. | |
| 2017/0222409 A1 | 8/2017 | Oehring et al. | |
| 2017/0259227 A1 | 9/2017 | Morris et al. | |
| 2017/0302135 A1 | 10/2017 | Cory | |
| 2018/0156210 A1 | 6/2018 | Oehring et al. | |
| 2018/0363434 A1 | 12/2018 | Coli et al. | |
| 2018/0363435 A1 | 12/2018 | Coli et al. | |
| 2018/0363436 A1 | 12/2018 | Coli et al. | |
| 2018/0363437 A1 | 12/2018 | Coli et al. | |
| 2018/0363438 A1 | 12/2018 | Coli et al. | |
| 2018/0374607 A1 | 12/2018 | Hernandez et al. | |
| 2019/0055827 A1 | 2/2019 | Coli et al. | |
| 2019/0112908 A1 | 4/2019 | Coli et al. | |
| 2019/0169971 A1 | 6/2019 | Oehring et al. | |
| 2019/0211661 A1 | 7/2019 | Reckels et al. | |
| 2019/0271218 A1 | 9/2019 | Coli et al. | |
| 2019/0277125 A1 | 9/2019 | Coli et al. | |
| 2019/0277126 A1 | 9/2019 | Coli et al. | |
| 2019/0277127 A1 | 9/2019 | Coli et al. | |
| 2019/0277128 A1 | 9/2019 | Coli et al. | |

FOREIGN PATENT DOCUMENTS

| | | | |
|---|---|---|---|
| AR | 104824 | A2 | 8/2017 |
| AR | 104825 | A2 | 8/2017 |
| AR | 104826 | A2 | 8/2017 |
| AR | 087298 | A1 | 12/2017 |
| CA | 2773843 | A | 10/2012 |
| CA | 2835904 | A1 | 10/2012 |
| CA | 2955706 | A1 | 10/2012 |
| EP | 3444430 | A1 | 2/2019 |
| EP | 3444431 | A1 | 2/2019 |
| EP | 3444432 | A1 | 2/2019 |
| EP | 3447239 | A1 | 2/2019 |
| EP | 3453827 | A2 | 3/2019 |
| EP | 3456915 | A1 | 3/2019 |
| MX | 358054 | B | 8/2018 |
| MX | 362628 | B | 1/2019 |
| MX | 365888 | B | 6/2019 |
| MX | 365889 | B | 6/2019 |
| MX | 366049 | B | 6/2019 |
| WO | 2012137068 | A2 | 10/2012 |
| WO | 2014053056 | A1 | 4/2014 |
| WO | 2018071738 | A1 | 4/2018 |

OTHER PUBLICATIONS

MX362628 Espacenet English Abstract, Publication Date of Jan. 29, 2019, 1 page.

MX365888 Espacenet English abstract, Publication date of Jun. 19, 2019, 1 page.

MX365889 Espacenet English Abstract, Publication Date of Jun. 19, 2019, 1 page.

MX366049B Espacenet English Abstract, Publication Date of Jun. 26, 2019, 1 page.

PCT Int'l Search Report filed in copending PCT Application No. PCT/US2018/039982 dated Sep. 11, 2018, 8 pages.

PCT Int'l Search Report filed in copending PCT Application No. PCT/US2018/039976 dated Nov. 5, 2018, 12 pages.

* cited by examiner

SECTION B-B VIEW

ELECTRIC POWER DISTRIBUTION FOR FRACTURING OPERATION

CROSS-REFERENCE TO RELATED APPLICATIONS

This application is a continuation of U.S. application Ser. No. 16/021,691 filed Jun. 28, 2018, which claims benefit to U.S. Provisional Application No. 62/526,869 filed Jun. 29, 2017, the contents of both of which are incorporated herein in their entirety by reference.

BACKGROUND

Hydraulic fracturing has been commonly used by the oil and gas industry to stimulate production of hydrocarbon producing wells, such as oil and/or gas wells. Hydraulic fracturing, sometimes called "fracing" or "fracking" is the process of injecting fracturing fluid into a wellbore to fracture the subsurface geological formations and release hydrocarbons. The fracturing fluid is pumped into a wellbore at a pressure sufficient to cause fissures within the underground geological formations. Once inside the wellbore, the fracturing fluid fractures the underground formation. The fracturing fluid may include water, various chemical additives, and proppants that promote the extraction of the hydrocarbon reserves, such as oil and/or gas. Proppants, such as fracturing sand, prevent fissures and fractures in the underground formation from closing; thereby, allowing the formation to remain open so that hydrocarbons flow through the hydrocarbon wells.

Implementing fracturing operations at well sites requires extensive investment in equipment, labor, and fuel. A typical fracturing operation uses fracturing equipment, personnel to operate and maintain the fracturing equipment, large amounts of fuel to power the fracturing operations, and relatively large volumes of fracturing fluids. As such, planning for fracturing operations is complex and encompasses a variety of logistical challenges that include minimizing the on-site area or "footprint" of the fracturing operations, providing adequate power and/or fuel to continuously power the fracturing operations, increasing the efficiency of the hydraulic fracturing equipment, and reducing the environmental impact resulting from fracturing operations. Thus, numerous innovations and improvements of existing fracturing technology are needed to address the variety of complex and logistical challenges faced in today's fracturing operations.

SUMMARY

The following presents a simplified summary of the disclosed subject matter in order to provide a basic understanding of some aspects of the subject matter disclosed herein. This summary is not an exhaustive overview of the technology disclosed herein, and it is not intended to identify key or critical elements of the invention or to delineate the scope of the invention. Its sole purpose is to present concepts in a simplified form as a prelude to the more detailed description that is discussed later.

In one embodiment, an apparatus comprising a hydration tank, a fracturing blender, and an internal manifold system. The internal manifold system couples the hydration tank and the fracturing blender to route fluid between the hydration tank and the fracturing blender. The apparatus also comprises a single transport frame that couples the hydration tank, the fracturing blender, and the internal manifold system to form a single transport.

In another embodiment, a method for producing fracturing fluid, comprising receiving source fluid from one or more inlet manifolds of a single transport and driving a first pump mounted on the single transport to route the source fluid from the inlet manifolds into a hydration tank mounted on the single transport. The method also drives second pump mounted on the single transport to route hydrated fluid produced by the hydration tank to a blending tub mounted on the single transport and discharges fracturing fluid produced by the blending tub to one or more outlet manifolds of the single transport.

In yet another embodiment, a transport comprising a transport frame, an internal manifold system coupled to the transport frame, and a hydration tank coupled to the transport frame. The hydration tank is configured to receive a source fluid from the internal manifold system, produce a hydrated fluid with a target viscosity based on the source fluid, and output the hydrated fluid to the internal manifold system. The transport also comprises a blender coupled to the transport frame, where the blender is configured to receive the hydrated fluid from the internal manifold system, produce a fracturing fluid based on the hydrated fluid, and discharge the hydrated fluid to the internal manifold system. The delivery rate of the hydrated fluid for the hydration tank corresponds to an amount of fracturing fluid the blender provides to one or more fracturing pump transports.

In another embodiment, an electric fracturing system comprises a switch gear transport electrically connected to a power generation source to provide electric power at a first voltage level. The electric fracturing system also comprises an electrical cable that supplies electric power at the first voltage level and a fracturing pump transport electrically connected to the switch gear transport via only the electrical cable. The fracturing pump transport comprises a transformer that steps down the electric power received at the first voltage level to a lower voltage level. The fracturing pump transport is not electrically connected to the switch gear transport via another electrical cable at a voltage level that differs from the first voltage level.

In another embodiment, a transport that comprises a single transport frame and an electric prime mover mounted on the single transport frame. The pump is coupled to the electric prime mover and mounted on the single transport frame and a transformer coupled to the electric prime mover and mounted on the single transport frame. The transformer is configured to receive electric power at a first voltage level from a power source via a single cable assembly and step down the electric power at the first voltage level to a lower voltage level. The transformer is also configured to supply the electric power at the lower voltage level to the electric prime mover, where the transport is not connected to any other cable assemblies that supply electric power at the first voltage level and other voltage levels.

In yet another embodiment, a method for electric power distribution used for fracturing operations. The method comprises receiving, at a transport, electric power from a mobile source of electricity at a first voltage level, where the first voltage level falls within a range of 1,000 V to 35 kilovolts and supplying, from the transport, the electric power to a fracturing pump transport at the first voltage level using only a first, single cable connection. The method also includes supplying, from the transport, the electric power to a second transport at the first voltage level using only a second, single cable connection.

In yet another embodiment, each of the above described embodiments and variations thereof, may be implemented as a method, apparatus, and/or system.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

Figure 1:
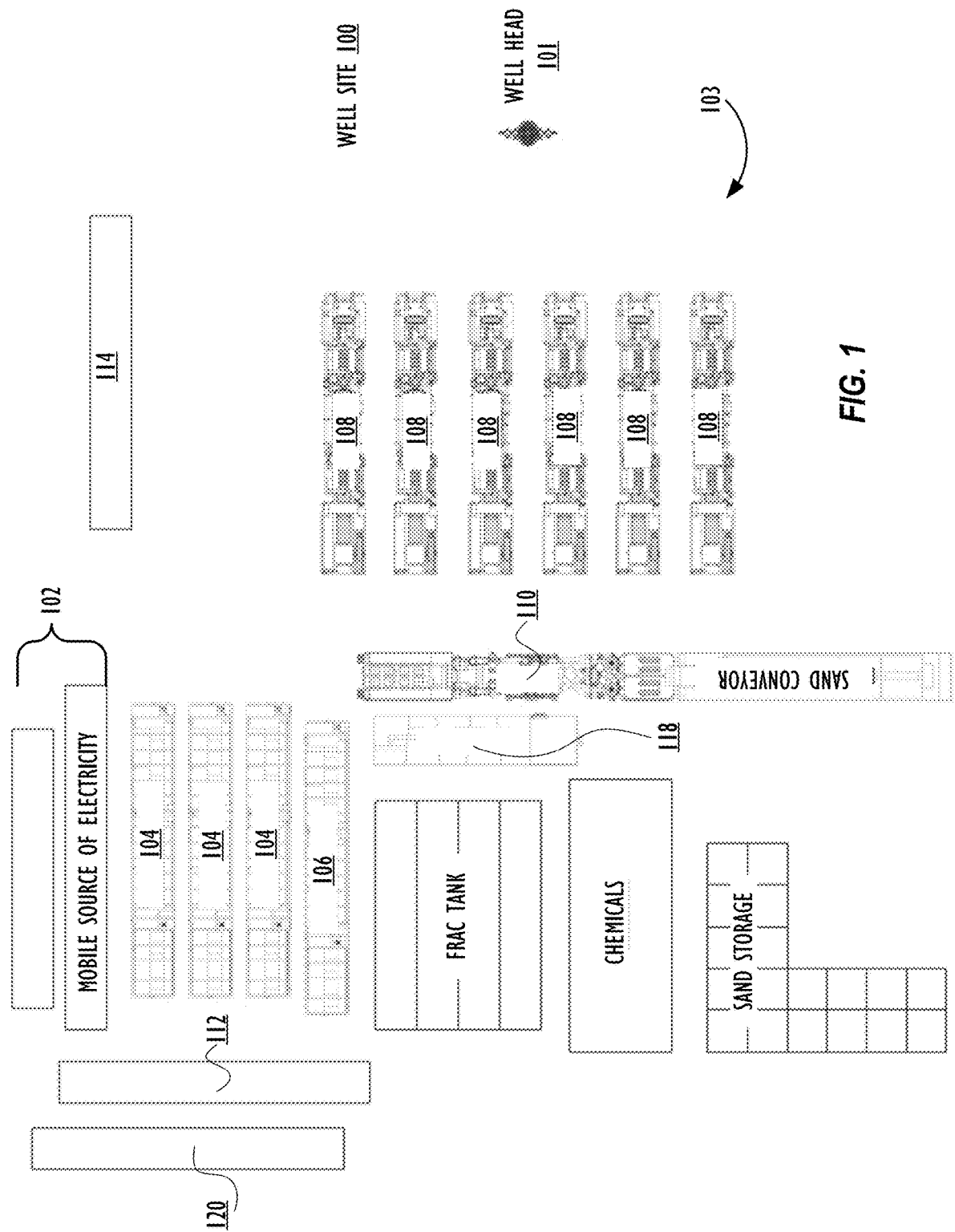
FIG. 1 is a schematic diagram of an embodiment of a well site that comprises a wellhead and a mobile fracturing system.

While certain embodiments will be described in connection with the illustrative embodiments shown herein, the invention is not limited to those embodiments. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

The term "fracturing sand" is used in this disclosure to serve as a non-limiting example of a proppant used as a component of fracturing fluid. "Fracturing sand" is also used herein to collectively refer to both wet and dry fracturing sand. Embodiments in this disclosure are not limited to fracturing sand and any other type of proppant, such as man-made ceramics, aluminum beads and sintered bauxite, can be used with the various embodiments presented in the disclosure. Unless otherwise specified within the disclosure, the term "fracturing sand" can be interchanged throughout this disclosure with the term "proppants."

As used herein, the term "wet fracturing sand" refers to a quantity of fracturing sand that contains a moisture content of about one percent or more, which is typically determined based on weight. "Dry fracturing sand" refers to quantities of fracturing sand that contain a moisture content of less than about one percent. As used herein, the term "liquefying wet fracturing sand" refers to enhancing and transforming the flow properties of wet fracturing sand to be substantially similar to dry fracturing sand in order to accurately control the amount of metered fracturing sand. Wet fracturing sand can liquefy and flow when shaken with force.

As used herein, the term "transport" refers to any transportation assembly, including, but not limited to, a trailer, truck, skid, rail car, and/or barge used to transport relatively heavy structures and/or other types of articles, such as fracturing equipment and fracturing sand. A transport could be independently movable from another transport. For example, a first transport can be mounted or connected to a motorized vehicle that independently moves the first transport while an unconnected second transport remains stationary.

As used herein, the term "trailer" refers to a transportation assembly used to transport relatively heavy structures and/or other types of articles (such as fracturing equipment and fracturing sand) that can be attached and/or detached from a transportation vehicle used to pull or tow the trailer. As an example, the transportation vehicle is able to independently move and tow a first trailer while an unconnected second trailer remains stationary. In one or more embodiments, the trailer includes mounts and manifold systems to connect the trailer to other fracturing equipment within a fracturing system or fleet. The term "lay-down trailer" refers to a specific embodiment of a trailer that includes two sections with different vertical heights. One of the sections or the upper section is positioned at or above the trailer axles and another section or the lower section is positioned at or below the trailer axles. In one embodiment, the main trailer beams of the lay-down trailer may be resting on the ground when in operational mode and/or when uncoupled from a transportation vehicle, such as a tractor.

As used herein, the term "low voltage" refers to a voltage range from about 50 volts (V) to 1,000 V for alternating current (AC) electric power. The term "medium voltage" refers to a voltage range from about 1,000 V to about 35 kilovolts (kV) for AC electric power, and the term "high voltage" refers to a voltage range greater than 35 kV for AC electric power. Although the terms "low voltage," "medium voltage," and "high voltage" generally refer to voltage ranges in AC electric power, the disclosure is not limited to AC electric power and could also utilize current (DC) voltage.

Unless otherwise specified within the disclosure, the term "electrical connection" refers to connecting one transport to another transport using one or more electrical cables. The term "electrical cable" can be interchanged throughout this disclosure with the term "power cable" "power cable connection," "cable connection," or "electrical cable connection." The terms "electrical cable," "power cable" "power cable connection," "cable connection," and "electrical cable connection" refer to a single cable assembly that bundles together one or more wires (e.g., copper wires) that carry AC or DC electric current to provide electric power. In one or more embodiments, the single cable assembly also includes other wire types, such as fiber optic wires that perform other functions besides providing electric power. For example, the fiber optic wires are able to carry light for the purposes of transferring communication signals.

Various example embodiments are disclosed herein for performing mobile fracturing operations using a hydration-blender transport. Rather than having a hydration transport that is separate and independent from a blender transport, a fracturing fleet may replace two or more different transports with a single hydration-blender transport. The hydration-blender transport includes a hydration tank and a blender unit (e.g., a single configuration blender or a dual configuration blender) interconnected with each other using the hydration-blender transport's internal manifold system. The internal manifold system directly couples the hydration tank and blender unit such that the hydration tank is able to provide fracturing fluid to the blender unit without requiring manifolds or other fluid connections (e.g., piping or hoses) that are external to the hydration-blender transport. To draw in source fluid, such as water or a fluid mixture (e.g., water with chemical additives), via one or more inlet manifolds, the hydration-blender transport comprises a plurality of electric prime movers that drive a plurality of pumps. Based on how an operator configures the inlet valves of the internal manifold system, the hydration-blender transport can transfer the source fluid to the hydration tank and blender unit, or completely by-pass the hydration tank and blender unit and transport the source fluid directly to one or more outlet manifolds. By doing so, the hydration-blender transport is able to perform a variety of operations that include, but are not limited to straight through operations, hydration-blender operations, and split stream operations.

Also disclosed are various example embodiments that distribute electric power from a mobile source of electricity. In one embodiment for fracturing operations, a power distribution system positions the voltage step down operation downstream and in close proximity to the fracturing equipment within a mobile fracturing system. As an example, a fracturing pump transport and a hydration-blender transport both include transformers that step down a supplied voltage level to one or more lower voltage levels that the fracturing equipment (e.g., electric prime movers) utilizes. The transports could also include drives (e.g., variable frequency drives (VFDs)) to control and monitor the electric prime movers. By doing so, the mobile fracturing system is able to reduce the number of transports by eliminating the use of an auxiliary unit transport (e.g., auxiliary unit transport 106 in FIG. 2) and/or drive power transports (e.g., drive power transports 104 in FIG. 2). A switch gear transport within the mobile fracturing system is then able to directly provide to the other transports, such as a hydration-blender transport and the fracturing pump transport, electric power at a relatively high medium voltage level (e.g., 13.8 kV); thereby, reducing the number of electrical cables to power fracturing equipment. For example, the switch gear transport may connect to each fracturing pump transport using a single electrical cable that supplies electric power at 13.8 kV. Each transformer mounted on the fracturing pump transport is then able to step down the supplied electric power to different voltage levels (e.g., 4.2 kV and 480 V) and provide enough electric current to power fracturing equipment.

FIG. 1 is a schematic diagram of an embodiment of a well site 100 that comprises a wellhead 101 and a mobile fracturing system 103. Generally, a mobile fracturing system 103 may perform fracturing operations to complete a well and/or transform a drilled well into a production well. For example, the well site 100 may be a site where operators are in the process of drilling and completing a well. Operators may start the well completion process with vertical drilling, running production casing, and cementing within the wellbore. The operators may also insert a variety of downhole tools into the wellbore and/or as part of a tool string used to drill the wellbore. After the operators drill the well to a certain depth, a horizontal portion of the well may also be drilled and subsequently encased in cement. The operators may subsequently pack the rig and move a mobile fracturing system 103 onto the well site 100 to perform fracturing operations that force relatively high pressure fracturing fluid through wellhead 101 into subsurface geological formations to create fissures and cracks within the rock. The mobile fracturing system 103 may then be moved off the well site 100 once the operators complete fracturing operations. Typically, fracturing operations for well site 100 may last several days or weeks.

As shown in FIG. 1, the mobile fracturing system 103 includes a mobile source of electricity 102 configured to generate electricity by converting hydrocarbon fuel, such as natural gas, obtained from one or more other sources (e.g., a producing wellhead, gathering pipe systems and/or pipelines) at well site 100, from a remote offsite location, and/or another relatively convenient location near the mobile source of electricity 102. The mobile source of electricity 102 supplies the generated electricity to fracturing equipment to power fracturing operations at one or more well sites. In particular, the mobile source of electricity 102 may supply electric power to fracturing equipment within the mobile fracturing system 103 that includes, but is not limited to, the switch gear transport 112, drive power transports 104, auxiliary unit transport 106, blender transport 110, data van 114, hydration transport 118, auxiliary power transport 120, and fracturing pump transports 108 in order to deliver fracturing fluid through wellhead 101 to subsurface geological formations.

The switch gear transport 112 may receive the electricity generated from the mobile source of electricity 102 via one or more electrical connections. In one embodiment, the switch gear transport 112 uses 13.8 kilovolts (kV) electrical connections to receive power from the mobile source of electricity 102. The switch gear transport 112 may comprise a plurality of electrical disconnect switches, fuses, transformers, and/or circuit protectors to protect other fracturing equipment within the mobile fracturing system 103. The switch gear transport 112 may then transfer the electricity received from the mobile source of electricity 102 to the drive power transports 104 and auxiliary unit transports 106. The power distribution system to supply power from the mobile source of electricity 102 to the mobile fracturing system 103 is discussed in more detail in FIG. 2.

The auxiliary unit transport 106 may comprise a transformer and a control system to control, monitor, and provide power to the electrically connected fracturing equipment. In one embodiment, the auxiliary unit transport 106 receives a relatively higher medium voltage (e.g., 13.8 kV) electrical connection and steps down the electric power to a lower voltage. For example, the auxiliary unit transport 106 steps down the voltage level from 13.8 kV to 480 V. The auxiliary unit transport 106 may then provide the stepped down voltage to other fracturing equipment, such as the blender transport 110, sand storage and conveyor, data van 114, and lighting equipment.

The drive power transports 104 may be configured to monitor and control one or more electric prime movers located on the fracturing pump transports 108 via a plurality of connections, such as electrical connections (e.g., copper wires), fiber optics, wireless, and/or combinations thereof. The drive power transports 104 may also receive power from the switch gear transport 112 and step down the 13.8 kV electrical connection to lower voltages. In one embodiment, the drive power transports 104 may step down the voltage to 4.2 kV rather than other lower voltage levels, such as 600 V, in order to reduce cable size of the electrical cable and the number of electrical cables used to connect the mobile fracturing system 103. In FIG. 1, the fracturing pump transport 108 utilizes the electric power received from the drive power transport 104 to power one or more electric prime movers that convert electric power to mechanical power in order to drive one or more pumps.

To form fracturing fluid, the hydration transport 118 combines a fluid, such as water from a frac tank, with a polymer-based slurry to produce a hydrated fluid with a target viscosity. The polymer-based slurry may be a viscous slurry concentrate that contains hydratable polymers that include, but are not limited to guar gum, hydroxypropyl guar (HPG), carboxymethyl HPG, carboxymethyl hydroxyethyl cellulose, and combinations thereof. Because the polymer-based slurry has a specified hydration rate, the viscosity level of the hydrated fluid after initially combining the polymer-based slurry with the fluid may not equal the target viscosity. Typically, the hydrated fluid requires a certain amount of mixing time (also known as residence time) to hydrate the polymer-based slurry so that the hydrated fluid reaches the target viscosity. For example, after combining the source fluid with the polymer-based slurry, the viscosity of the hydrated fluid increases as the degree of hydration of the polymer-based slurry increases.

In one embodiment, the blender transport 110 receives electric power from the auxiliary unit transport 106 to power a plurality of electric prime movers to perform a variety of blending operations. For instance, some of the electric prime movers may drive one or more pumps to route source fluid to the blender transport 110 to produce fracturing fluid. Non-limiting examples include directing source fluid (e.g., hydrated fluid from the hydration transport 118) received at one or more inlet manifolds into one or more blending tubs and/or discharging fracturing fluid via one or more outlet manifolds to supply fracturing fluid to the fracturing pump transports 108. Other electric prime movers may power other blending operations, such as metering the fracturing sand into the blending tubs and mixing hydrated fluid with fracturing sand to form the fracturing fluid.

The data van 114 may be part of a control network system, where the data van 114 acts as a control center configured to monitor and provide operating instructions in order to remotely operate the hydration transport 118, the blender transport 110, the mobile source of electricity 102, fracturing pump transport 108 and/or other fracturing equipment within the mobile fracturing system 103. For example, the data van 114 may communicate via the control network system with the VFDs located within the drive power transports 104 that operate and monitor the health of the electric motors used to drive the pumps on the fracturing pump transports 108. Other fracturing equipment shown in FIG. 1, such as gas conditioning transport, frac tanks, chemical storage of chemical additives, sand conveyor, and sand container storage are known by persons of ordinary skill in the art, and therefore are not discussed in further detail.

In one embodiment, rather than having a separate hydration transport 118 and blender transport 110, the mobile fracturing system 103 could include a single hydration-blender transport (not shown in FIG. 1). Using FIG. 1 as an example, the hydration-blender transport receives electric power from the auxiliary unit transport 106 to power a plurality of electric prime movers to perform a variety of hydration and blending operation. As an example, the hydration tank of the hydration-blender transport could be configured to perform a continuous hydration process to hydrate a polymer-based slurry with the source fluid to reach the target viscosity. Implementing a continuous hydration process rather than a batch process allows the hydration tank to produce hydrated fluid as needed or in real-time, where the rate of hydrated fluid production corresponds to the amount of fracturing fluid the blender unit provides to the fracturing pump transport 108. To provide an adequate amount of residence time to hydrate the polymer-based slurry, the hydration tank may direct the hydrated fluid to travel a torturous flow path that delays supplying the hydrated fluid to the blender unit.

The torturous flow path may be configured to provide a minimal amount of residence time for a given flow rate to produce hydrated fluid with the target viscosity. Moreover, the torturous flow path is configured to hold a targeted volume of hydrated fluid to sustain a delivery rate of the hydrated fluid to the blender unit. For example, to provide a targeted flow rate of about 80 to 100 barrels per minute (bpm) and a residence time of about three minutes, the torturous flow path or volume of the hydration tank would need to hold at least about 240 barrels. As the hydrated fluid travels through the torturous flow path, the torturous flow path may also be configured to further mix, agitate, and apply shear forces that enhance hydration of the polymer-based slurry. The torturous flow path for the hydration tank may be implemented using a variety of methods known by persons of ordinary skill in the art.

One or more pumps on the hydration-blender transport may then direct the hydrated fluid with the target viscosity to the blender unit to mix fracturing sand with the hydrated fluid. In one embodiment, the hydration-blender transport may include a dual configuration blender that comprises electric prime movers (e.g., electric motors) for the rotating machinery. The dual configuration blender may have two separate blending tubs configured to be independent and redundant, where any one or both of the blending tubs may receive hydrated fluid that originated from any of the inlet manifolds. In other words, source fluid received from any of the inlet manifolds may subsequently be hydrated and then blended by any one or both of the blending tubs. Afterwards, the blended fracturing fluid is discharged out of any of the outlet manifolds. In one embodiment, when both blending tubs are operational, the dual configuration blender may have a blending capacity of up to about 240 bpm. Other embodiments of the hydration-blender transport may utilize a single configuration blender that only has a single blending tub.

Combining the hydration tank and blender into a single hydration-blender transport also allows the hydration-blender transport to support a variety of operation modes, such as straight through operation mode, hydration operation mode, and/or split stream operation mode. In a straight through operation mode, the hydration-blender transport receives the source fluid from one or more inlet manifolds and directly discharges the source fluid to one or more outlet manifolds by having the source fluid bypass both the hydration tank and blending tubs of the blender unit. By doing so, the hydration-blender transport supplies source fluid, which can also be referred to as clean fluid, to one or more fracturing pump transports 108. In hydration operation mode, the hydration-blender transport directs the source fluid into the hydration tank, pumps the hydrated fluid into the blending tubs to form fracturing fluid and discharges the fracturing fluid, which can also be referred to as dirty fluid, to one or more outlet manifolds. In a split stream operation mode, the hydration-blender transport is able to discharge both clean fluid and dirty fluid to different outlet manifolds. To supply a split stream to the fracturing pump transports, a portion of the source fluid bypasses both the hydration tank and blending tubs and directly flows out to the outlet manifolds, and a remaining portion of the source fluid is directed into the hydration tank to generate the dirty fluid.

Having a hydration-blender transport with different operation modes provides operators flexibility in utilizing a variety of fracturing fluids. Specifically, the hydration-blender transport is flexible enough to provide clean fluid, dirty fluid, or both based on an operator's desired fracturing operation. Using FIG. 1 as an example, the mobile fracturing system 103 may have some of the fracturing pump transports 108 pump clean fluid and other fracturing pump transports 108 pump dirty fluid as fracturing fluid. An operator may desire to utilize clean fluid as fracturing fluid because of the potential benefits of increasing and enhancing the life of fracturing pumps. Because of additional wear fracturing sand and the polymer-based slurry may cause, pumps and manifold equipment exposed to dirty fluid are often susceptible to higher maintenance costs and/or decreases in useful life when compared to pumps and manifold equipment operating with clean fluid. As such, by having some of the fracturing pump transports 108 pump clean fluid, an operator may reduce fracturing operating costs.

Power Distribution from a Mobile Source of Electricity

Figure 2:
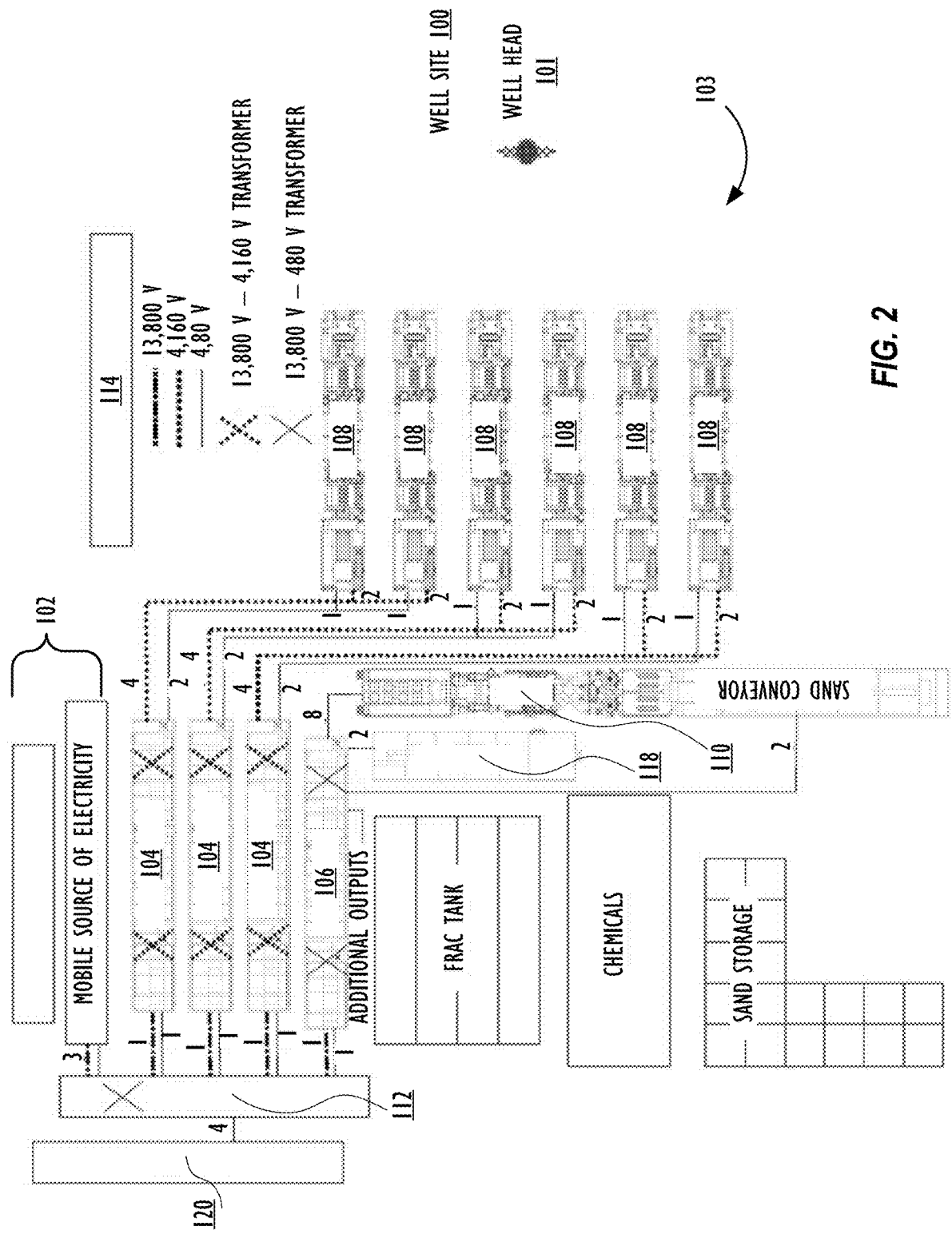
FIG. 2 is a schematic diagram of an embodiment of a medium-low voltage power distribution system for the mobile fracturing system.

FIG. 2 is a schematic diagram of an embodiment of a medium-low voltage power distribution system for the mobile fracturing system 103. Although the voltage and current levels referenced in FIG. 2 generally refer to AC electric power, other embodiments could have the mobile fracturing system 103 configured to be powered using DC electric power. As shown in FIG. 2, the mobile source of electricity 102 provides power by connecting to the switch gear transport 112 using three medium voltage (e.g., 13.8 kV) cable connections. In one or more embodiments, the mobile source of electricity 102 includes a turbine-electric generator transport that compresses and mixes combustion air with hydrocarbon gas to spin and generate mechanical energy and then converts the mechanical energy to electricity. The mobile source of electricity 102 could also include an inlet and exhaust transport that provides ventilation and combustion air to the turbine-electric generator transport when generating electricity. Configuring and utilizing a turbine-electric generator transport and an inlet and exhaust transport are discussed and shown in more detail in U.S. Pat. No. 9,534,473, filed Dec. 16, 2015 by Jeffrey G. Morris et al. and entitled "Mobile Electric Power Generation for Hydration Fracturing of Subsurface Geological Formations," which is hereby incorporated by reference as if reproduced in its entirety. In other embodiments, the mobile source of electricity 102 could include other transport configurations to employ a centralized source of electricity that powers fracturing equipment.

The switch gear transport 112 contains a transformer that steps down the medium voltage (e.g., 13.8 kV) electric power to a low voltage level (e.g., 480 V) and provides a low voltage (e.g., 480 V) electrical connection to other transports. Using FIG. 2 as an example, the switch gear transport 112 connects to the drive power transports 104 and the auxiliary unit transport 106 using the 480 V electrical connection. FIG. 2 also illustrates that the switch gear transport 112 utilizes four 480 V cable connections from an auxiliary power transport 120 that provides electric power to ignite, start, or power on the mobile source of electricity 102 and/or provide ancillary power where peak electric power demand exceeds the electric power output of mobile source of electricity 102. Although not shown in FIG. 2, in other embodiments, the switch gear transport 112 may also include a transformer to step down the electric power from a medium voltage level (e.g., 13.8 kV) to a relatively lower medium voltage level (e.g., 4.2 kV) and provide the relatively lower medium voltage level (e.g., 4.2 kV) directly to the drive power transports 104.

As shown in FIG. 2, both the hydration transport 118, blender transport 110, and fracturing pump transports 108 do not contain transformers to step down the voltage for the switch gear transport's 112 electric power. Instead, the voltages supplied to power the fracturing equipment (e.g., the electric prime movers) are stepped down upstream at different transports within the mobile fracturing system 103. As an example, the drive power transports 104 may be operable to step down a medium voltage level (e.g., 13.8 kV) that the switch gear transport 112 supplies to a relatively lower medium voltage level (e.g., 4.2 kV), and the auxiliary unit transport 106 may be able to step down a medium voltage level (e.g., 13.8 kV) that the switch gear transport 112 supplies to a low voltage level (e.g., 480 V). In other examples, switch gear transport 112 may include other transformers that step down the voltage to other voltages. The drive power transports 104 and auxiliary unit transport 106 then supply the stepped down voltages to power electric prime movers mounted on transports (e.g., blender transport 110 and fracturing pump transports 108) and other fracturing equipment. In one or more embodiments, the transformers and/or drives (e.g., VFDs) for controlling the electric prime movers may be placed on drive power transports 104 and/or auxiliary unit transport 106 because the fracturing pump transports 108 and/or blender transports 110 may not have enough space or may exceed a specific weight limit.

In FIG. 2, the switch gear transport 112 provides a medium voltage (e.g., 13.8 kV) electrical connection and a low voltage (e.g., 480 V) electrical connection to the drive power transports 104. Specifically, each drive power transport 104 receives a single medium voltage (e.g., 13.8 kV) cable connection from the switch gear transport 112 and utilizes transformers to step down the voltage level of the received electric power from the medium voltage level (e.g., 13.8 kV) to a relatively lower medium voltage level (e.g., 4.2 kV). Each drive power transport 104 also receives a single low voltage (e.g., 480 V) cable connection from the switch gear transport 112. After the drive power transports 104 receives electric power from the switch gear transport 112, each drive power transport 104 provides electric power to two different fracturing pump transports 108. In other words, the mobile fracturing system 103 implements a 2:1 ratio regarding the number of fracturing pump transports 108 that receive electric power from a drive power transport 104. Other embodiments could have different ratios where the drive power transport 104 supply power to a single fracturing pump transport 108 (e.g., 1:1 ratio) or more than two fracturing pump transport 108 (e.g., 3:1 or 4:1 ratio).

As shown in FIG. 2, each drive power transport 104 supplies a low voltage (e.g., 480 V) cable connection and two relatively lower medium voltage (e.g., 4.2 kV) cable connections to power each fracturing pump transport 108. The low voltage cable connection may supply electric power to drives (e.g., VFDs) and/or other electrical equipment (e.g., sensors) mounted on the fracturing pump transport 108. The two medium voltage (e.g., 4.2 kV) cable connections supply electric power to one or more electric prime movers that drive one or more pumps that pump fracturing fluid into a wellbore. As an example, the fracturing pump transport 108 contains a 5,000 horsepower (HP) dual-shaft electric motor that utilizes about 600 amperes (A) of electric current to operate. The dual-shaft electric motor could be a dual-shaft electric motor that is discussed and shown in more detail in U.S. Pat. No. 9,534,473, filed Dec. 16, 2015 by Jeffrey G. Morris et al. and entitled "Mobile Electric Power Generation for Hydration Fracturing of Subsurface Geological Formations." To supply enough electric power, each of the medium voltage (e.g., 4.2 kV) cable connections could provide about 300 A of electric current. Having a single medium voltage (e.g., 4.2 kV) electrical cable that provides 600 A of electric current to the dual-shaft electric motor may not be desirable because of safety concerns with the relatively high current flow. Besides safety concerns regarding the relatively high current (e.g., 600 A) flow, having a single electrical cable could also cause connection and/or disconnections issues because of the thicker cable size used to support relatively high current flow.

FIG. 2 also illustrates that the switch gear transport 112 supplies a single medium voltage (e.g., 13.8 kV) cable connection and a single low voltage (e.g., 480 V) cable connection to an auxiliary unit transport 106. The auxiliary unit transport 106 includes at least one transformer to step down the voltage from the medium voltage level (13.8 kV) to the low voltage level (e.g., 480 V). The auxiliary unit transport 106 supplies a low voltage level (e.g., 480 V) electrical connection to both the hydration transport 118 and blender transport 110. In FIG. 2, the hydration transport 118 and blender transport 110 are separate and independent from each other, where the hydration transport 118 receives two low voltage (e.g., 480 V) cable connections and the blender transport 110 receives eight low voltage (e.g., 480 V) cable connections from the auxiliary unit transport 106. Other embodiments of the power distribution system may have the auxiliary unit transport 106 provide a low voltage (e.g., 480 V) electrical connection (e.g., ten cable connections) to a single hydration-blender unit transport for embodiments when the blender transport 110 and hydration transport 118 are integrated into a single transport.

Figure 3:
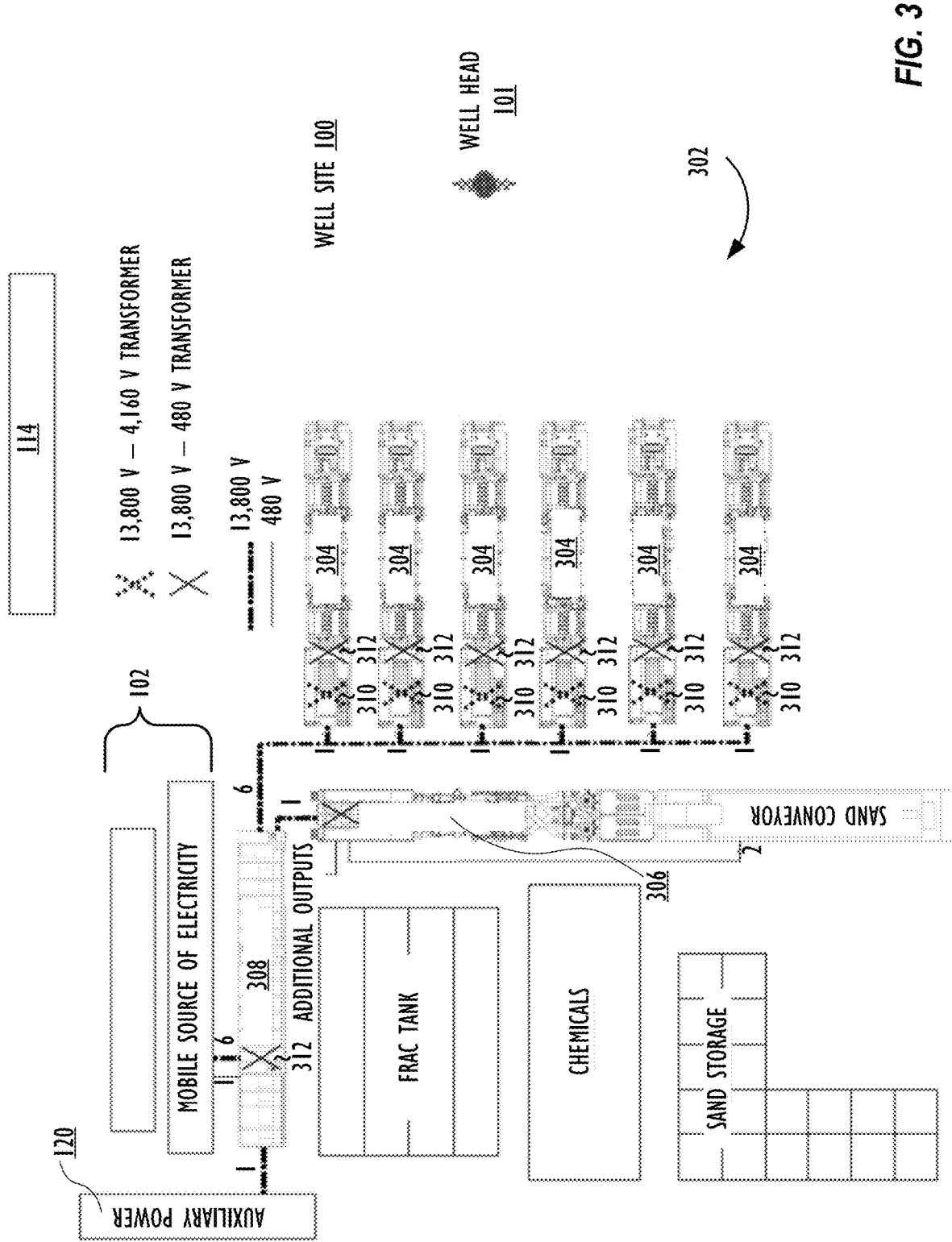
FIG. 3 is a schematic diagram of another embodiment of a medium voltage power distribution system for the mobile fracturing system.

FIG. 3 is a schematic diagram of another embodiment of a medium voltage power distribution system for the mobile fracturing system 302. In contrast to FIG. 2, the power distribution system moves the voltage step down further downstream by placing transformers 310 and/or 312 on the fracturing pump transports 304 and hydration-blender transport 306. As shown in FIG. 3, the mobile fracturing system 302 reduces the number of transports by eliminating the need for an auxiliary unit transport (e.g., auxiliary unit transport 106 in FIG. 2) and/or drive power transports (e.g., drive power transports 104 in FIG. 2). Instead, the drives (e.g., VFDs) to control and monitor the electric prime movers of the fracturing pump transports 304 and transformers 310 and/or 312 for stepping down the voltage for the electric power are mounted on the fracturing pump transport 304 and the hydration-blender transport 306.

FIG. 3 illustrates that switch gear transport 308 connects to a mobile source of electricity 102 with six medium voltage (e.g., 13.8 kV) cable connections. The switch gear transport also connects to an auxiliary power transport 120 with one medium voltage (e.g., 13.8 kV) cable connection. The switch gear transport 308 also includes a transformer 312 that steps down electric power received at a medium voltage level (e.g., 13.8 kV) from the auxiliary power transport 120 to a low voltage level (e.g., 480 V). The low voltage level (e.g., 480 V) connection may provide electric power to ignite, start, or power on the mobile source of electricity 102. In contrast to FIG. 2, the switch gear transport 308 does not output or provide low voltage (e.g., 480 V) electrical connections to other transports. Specifically, the switch gear transport 308 outputs and supplies medium voltage (e.g., 13.8 kV) cable connections directly to the hydration-blender transport 306 and the fracturing pump transport 304 without connecting to any intermediate transports (e.g., drive power transport 104 and auxiliary unit transport 106 in FIG. 2). FIG. 3 depicts that the switch gear transport 308 generates a total seven medium voltage (e.g., 13.8 kV) cable connection, where each fracturing pump transports 304 is directly connected to the switch gear transport 308 with a single medium voltage (e.g., 13.8 kV) cable connection. The switch gear transport 308 also directly connects to the hydration-blender transport 306 using a single medium voltage (e.g., 13.8 kV) cable connection.

The medium voltage power distribution system shown in FIG. 3 is able to reduce the number of electrical cables used to supply electric power to the fracturing pump transport 304 and hydration-blender transport 306 when compared to the medium-low power distribution system shown in FIG. 2. Specifically, when compared to the medium-low power distribution system shown in FIG. 2, the medium voltage power distribution system in FIG. 3 is able to reduce the number of electrical cables that provide power to each fracturing pump transport 304. As shown in FIG. 3, the mobile fracturing system 302 reduces the number of electrical cables from three electrical cables to one electrical cable for each fracturing pump transport 304. A further reduction of electrical cables is shown by supplying one electrical cable to the hydration-blender transport 306 instead of the ten electrical cables used to power both the blender transport 110 and hydration transport 118. One reason the medium voltage power distribution system is able to utilize less electrical cables is that each electrical cable does not need to supply a relatively high current (e.g., 600 A) to each of the fracturing pump transports 304 and hydration-blender transport 306. Supplying electric power at relatively lower current levels avoids the safety concerns and/or connection/disconnection issues associated with using a single electrical cable that supplies relatively high current (e.g., 600 A).

Each fracturing pump transport 304 may include one or more transformers to step down the voltage received from the switch gear transport 308 to different voltage levels. Using FIG. 3 as an example, each fracturing pump transport 304 may include two separate and independent transformers, a first transformer 310 to step down to a voltage level of 4.2 kV and a second transformer 312 to step down to a voltage level of 480 V. In other examples, each fracturing pump transport 304 could include a single transformer that produces multiple voltages levels. For example, the fracturing pump transport 304 may mount a three phase or three winding transformer to step down the voltage to two different voltage levels. Recall that the 4.2 kV voltage level supplies electric power to one or more electric prime movers that drive one or more pumps and the 480 V supplies electric power to the drives and/or other control instrumentation mounted on the fracturing pump transport 304. Transformers 310 and 312 are configured to supply enough electric current to power the prime movers, drivers, and/or other control instrumentation.

FIG. 3 also illustrates that the hydration-blender transport 306 may include a transformer that steps down the voltage level to 480 V. The hydration-blender transport 306 can use the stepped down voltages levels to provide electric power to the electric prime movers for the hydration-blender transport 306, drives, and/or other control instrumentation mounted on the hydration-blender transport 306. The hydration-blender transport 306 may also be configured to provide electric power at the 480 V voltage level to other downstream fracturing equipment, such as the sand conveyor. In FIG. 3, the medium voltage power distribution system may utilize two electrical connections to provide electric power to the sand conveyor. Although FIG. 3 illustrates that switch gear transport 308 provides electric power to a hydration-blender transport 306, other embodiments could have the switch gear transport 308 separately connect to a hydration transport and a blender transport. In such an embodiment, the switch gear transport 308 may connect to the hydration transport using a single medium voltage (e.g., 13.8 kV) cable connection and another single medium voltage (e.g., 13.8 kV) cable connection to connect to the blender transport.

By mounting the drives and transformers 310 and/or 312 onto the fracturing pump transport 304 and hydration-blender transport 306, the transports become individually autonomous by removing the need for other separate support-based trailers, such as the auxiliary unit transport and drive power transports that provide power conversion and/or drive control. Having autonomous trailers allows the mobile fracturing system 302 to become scalable and flexible, where each fracturing pump transport may be interchangeable with each other. For example, if the well is relatively small, the mobile fracturing system 302 may have a reduced number of fracturing pump transports 304 (e.g., four transports instead of six transports). Conversely, if the well is large and/or the well site is located at high elevations and/or high temperatures, more fracturing pump transports 304 can be stacked to increase pumping capacity without utilizing additional support-based transports (e.g., drive power transports 104 shown in FIGS. 1 and 2).

Although FIGS. 2 and 3 illustrates specific embodiments of mobile fracturing system 103 and 302 that utilize electric power for operations, the disclosure is not limited to these particular embodiments. For instance, with reference to FIG. 3, the disclosure describes a switch gear transport 308 receiving electric power from a mobile source of electric. However, other embodiments could have the switch gear transport 308 receive electric power from other types of power sources, such as a power grid or a stationary power source. Additionally or alternatively, the mobile fracturing system 302 shown in FIG. 3 may utilize a separate hydration transport and blender transport instead of the hydration-blender transport 306. The use and discussion of FIGS. 2 and 3 are only examples to facilitate ease of description and explanation.

Hydration-Blender Transport

Figure 4A:
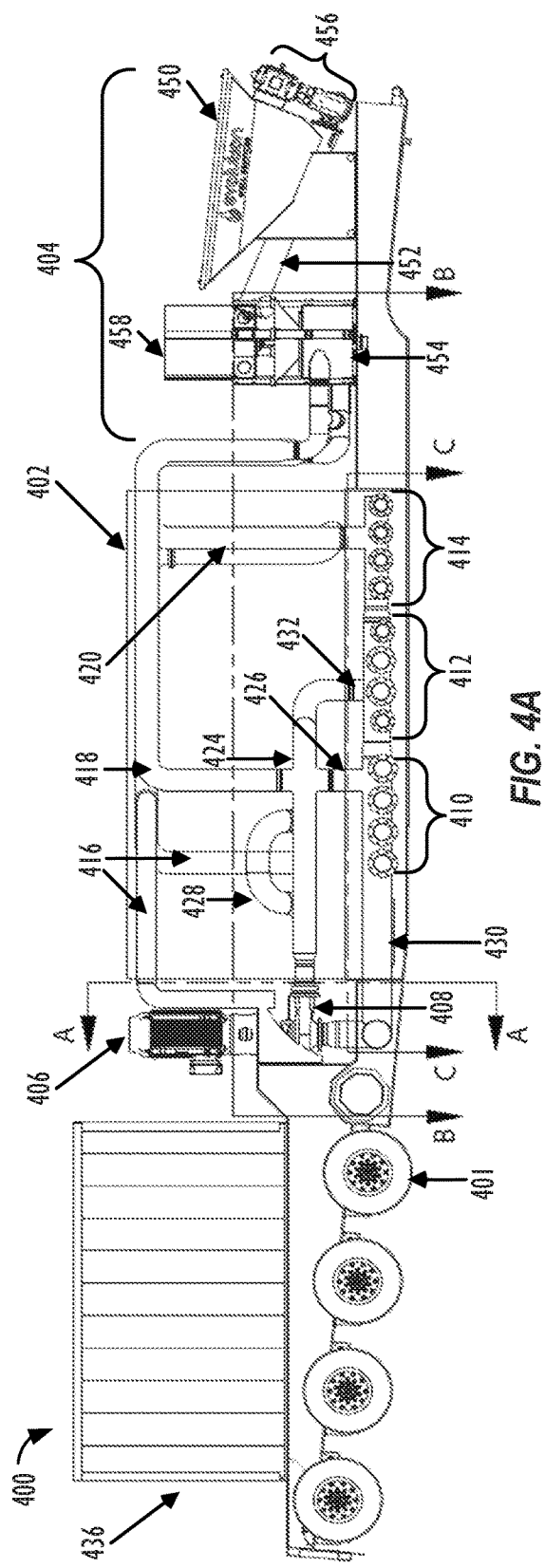
FIG. 4A illustrates a side view of an embodiment of a hydration-blender transport.

FIG. 4A illustrates a side view of an embodiment of a hydration-blender transport 400 that comprises a hydration tank 402, a blender unit 404, an electric prime mover 406, a pump 408, and multiple manifold groups 410, 412, and 414. FIG. 4A also depicts that the hydration-blender transport 400 as a trailer that includes four axles. Other embodiments of the hydration-blender transport 400 may vary the number of axles depending on the weight of the fracturing equipment and/or the size of the hydration tank 402. For example, the hydration-blender transport 400 may include three axles to allow for mounting of a hydration tank 402 with larger volume. By removing the axle 401 from the trailer, the hydration-blender transport 400 has more available space to mount a larger hydration tank 402.

Depending on the operation modes, the manifold groups 410, 412, and 414 may be configured as inlet manifolds that receive source fluid and/or outlet manifolds that supply fracturing fluid to one or more fracturing pump transports. The manifold groups 410, 412, and 414 are coupled to the hydration-blender transport's 400 internal manifold system to route fluid within the hydration-blender transport 400. The electric prime movers 406 (e.g., electric motors) may drive the pumps 408 to draw in and deliver source fluid to the hydration tank 402, blender unit 404, and/or directly to another manifold group based on the configuration of the internal manifold system. To implement a variety of operation modes, the internal manifold system includes a plurality of valves (not shown in FIG. 4A) configured to isolate different sections of the internal manifold system.

The internal manifold system may comprise a hydration tank manifold system 416, a hydration-blender manifold system 418, a blender output manifold system 420, an interconnector manifold system 424, and an under tank manifold system 430. The interconnector manifold system 424 may connect the manifold groups 410, 412, and 414, the pumps 408, the hydration tank manifold system 416, the hydration-blender manifold system 418, and the under tank manifold system 430 to each other. To connect the interconnector manifold system 424 to the manifold groups 410 and 412, connection points 426 and 432, respectively, may be used to connect the interconnector manifold system 424 to the under tank manifold system 430. The hydration tank manifold system 416 may be configured to receive source fluid from one or more of the manifold groups 410, 412, and 414 via the interconnector manifold system 424 to transport the source fluid within the hydration tank 402.

After the hydration tank 402 hydrates the polymer-based slurry with the source fluid, the hydration-blender manifold system 418 transports the hydrated fluid from the hydration tank 402 to blending tubs 454. Once the blending tubs 454 mix fracturing sand with the hydrated fluid to form fracturing fluid, the blender output manifold system 420 may then transport the fracturing fluid from the blender unit 404 to one or more manifold groups 410, 412, and 414. A feedback manifold system 428 may be configured to feedback liquid within the hydration tank 402 to maintain a desired level of hydrated fluid. The under tank manifold system 430 may be configured to connect the manifold groups 410, 412, and 414 to each other. Although not illustrated, the internal manifold system shown in FIG. 4 may include other components known by persons of ordinary skill in the art to monitor fluid properties and/or direct fluids within the hydration-blender transport 400, such as flow meters, densitometers, and valves.

As shown in FIG. 4A, the hydration-blender transport 400 may include a power and control system 436. In one embodiment, the power and control system 436 may include a drive (e.g., a VFD) to control the electric prime movers 406 and a transformer to step down incoming voltage. For example, the transformer is configured to receive a relative higher voltage (e.g., 13.8 kV) and step down the voltage level to 480 V. The power and control system 436 may also be configured to provide electric power at the 480 V voltage level to other downstream fracturing equipment, such as the sand conveyor. In another embodiment, the power and control system 436 may include the drive to control the electric prime movers 406, but may not include the transformer and instead receives power at the stepped down voltage (e.g., 480 V) from another transport.

FIG. 4A illustrates that the blender unit 404 is a dual configuration blender that includes two separate blending modules to produce fracturing fluid. Each blending module includes a blending tub 454, a hopper 450 (also known as surge tanks), and a metering component 452 (e.g., an auger). To power the blending operations, the blender unit 404 may also include prime movers 456 and 458. As shown in FIG. 4A, each of the blending modules includes an electric prime mover 456 to power the metering component 452 that meters fracturing sand into the blending tub 454, and an electric prime mover 458 to drive pumps to power the blending tub. The blending tub 454 mixes the fracturing sand and hydrated fluid received from the hydration-blender manifold system 418 to produce the fracturing fluid that discharges via the blender output manifold system 420. The blending tub 454 may discharge the fracturing fluid using a pump (not shown in FIG. 4A) driven by a prime mover.

In FIG. 4A, the metering component 452 is an auger positioned at an incline to meter the fracturing sand into a blending tub 454. Other embodiments of the blender unit 404 may have the metering component 452 positioned in a straight or horizontal orientation. Correctly controlling and metering fracturing sand into the blending tub 454 affects the overall proppant concentration of the fracturing fluid (e.g., weight of the slurry). Controlling the overall proppant concentration is advantageous because the overall proppant concentration could affect the proppant transport and the propped fracture dimensions of the subsurface geological formations and the realization of the hydraulic fracturing treatment.

The blender unit 404 unit may be configured to produce fracturing fluid using dry fracturing sand and/or wet fracturing sand. In one embodiment, to be able to produce fracturing fluid using wet fracturing sand, the blender unit 404 may include one or more vibrator components (e.g., mechanical vibrators, vibration screens, and acoustic generators), which are not shown in FIG. 4A, to liquefy sand and enhance the flow properties of the wet fracturing sand. The vibrator components may be powered by a variety of power sources that include, but are not limited to, air pressure, hydraulics, and/or electricity. When powering the vibrator components by electricity, the blender unit 404 includes electric motors to drive hydraulic pumps that operate the vibrator components. By controlling the electric motors, an operator is able to indirectly control one or more vibrator components via the hydraulic pressure. In another example, operators are able to control the one or more vibrator components directly by connecting one or more electric motors to one or more vibrator components. Adjusting the electric motors' attributes, such as frequency, voltage, and/or amperage could vary operation of the vibrator components. To reduce vibration and disturbances to other components of the hydration-blender transport 400, the blender unit 404 may include a vibration isolation system that include springs, air bags, rubber-based dampeners (e.g., rubber bushings), and/or other vibration isolation components. In embodiments where a vibration screen and/or acoustic waves are used to directly liquefy sand without vibrating the blending tub, the vibration isolation system may dampen and reduce the amount of vibration experienced by the blending tub. Processing and liquefying wet fracturing sand is discussed in more detail in U.S. patent application Ser. No. 15/452,415, filed Mar. 7, 2017 by Jeffrey G. Morris et al. and entitled "Utilizing Wet Fracturing Sand for Hydraulic Fracturing Operations," which is hereby incorporated by reference as if reproduced in its entirety.

Figure 4B:
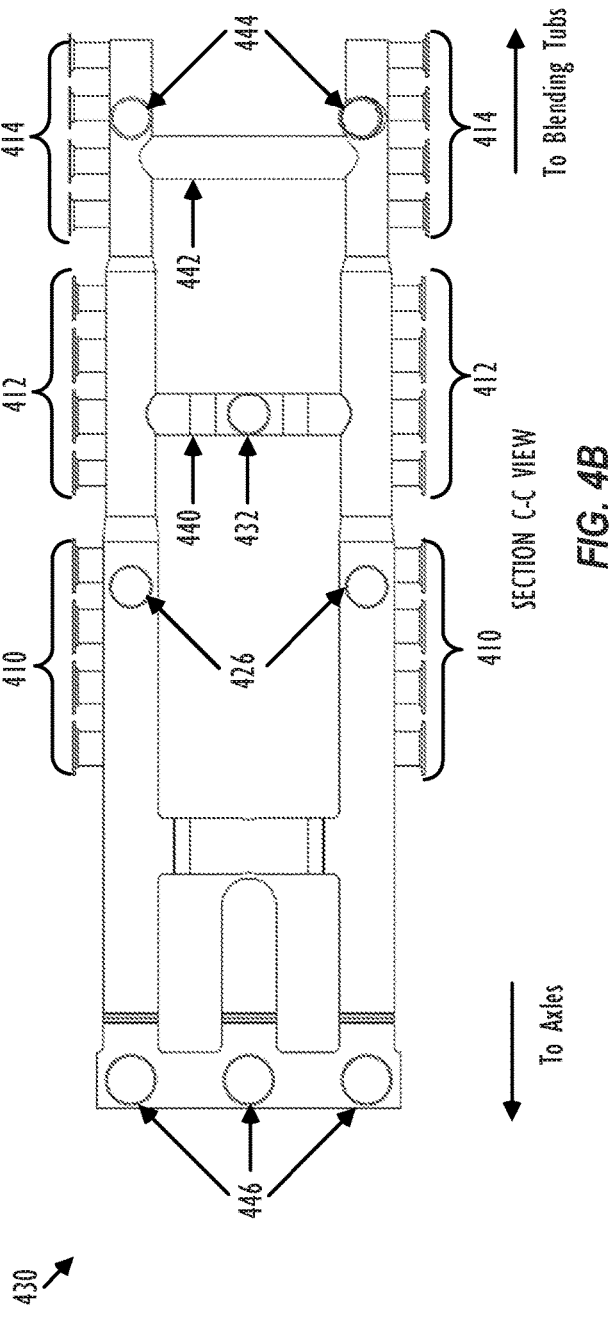
FIG. 4B illustrates an under tank cross sectional view of the hydration-blender transport.

FIG. 4B illustrates an under tank cross sectional view of the hydration-blender transport 400. Specifically, FIG. 4B represents the C-C cross sectional view illustrated in FIG. 4A that highlights the under tank manifold system 430. As shown in FIG. 4B, the under tank manifold system 430 includes two redundant sides that are coupled together using crossing manifolds 440 and 442. The blender output manifold system 420 discussed in FIG. 4A, connects to both sides of the under tank manifold system 430 at connection points 444 such that the output of one of the blending tubs connects to one side of the under tank manifold system 430. The crossing manifolds 440 and 442 allow fracturing fluid to be discharged to either side or both sides of the hydration-blender transport 400 and also allows the hydration tank to receive source fluid from either side of the hydration-blender transport 400. Each side of the under tank manifold system 430 also includes the manifold groups 410, 412, and 414, where each manifold group can be isolated using values (not shown in FIG. 4B). The crossing manifolds 440 and 442 may include valves to allow or prevent fluid from flowing to both sides of the under tank manifold system 430.

FIG. 4B also illustrates that the under tank manifold system 430 includes three pump connection points 446, connection points 426, and a connection point 432. The three pump connection points 446 interconnect the under tank manifold system 430 to the pumps 408 shown in FIG. 4A. FIG. 4A illustrates that the electric prime movers 406 are positioned above the pumps 408 such that one or more of the electric prime movers 406 may drive one or more pumps 408. The pumps 408 are then able to direct source fluid and/or fracturing fluid into and out of the under tank manifold system 430. For instance, the pumps 408 may be able to pump source fluid received from one or more manifold groups 410, 412, and 414 to the interconnector manifold system 424 via connection points 426. One or more valves can be set according to the operation mode for the hydration-blender transport 400. For example, to implement split streaming operation, a valve associated with the connection point 432 may be set to an open position such that source fluid received from the manifold groups 410, 412, and 414 is sent directly to another manifold groups 410, 412, and 414 (e.g., manifold group 412) and bypasses the hydration tank 402. In other words, the connection point 432 may be used to bypass the hydration tanks 402 and blending tubs 454 and directly pump source fluid received from one or more manifold groups 410, 412, and 414 back out to other manifold groups 410, 412, and 414.

Figure 4C:
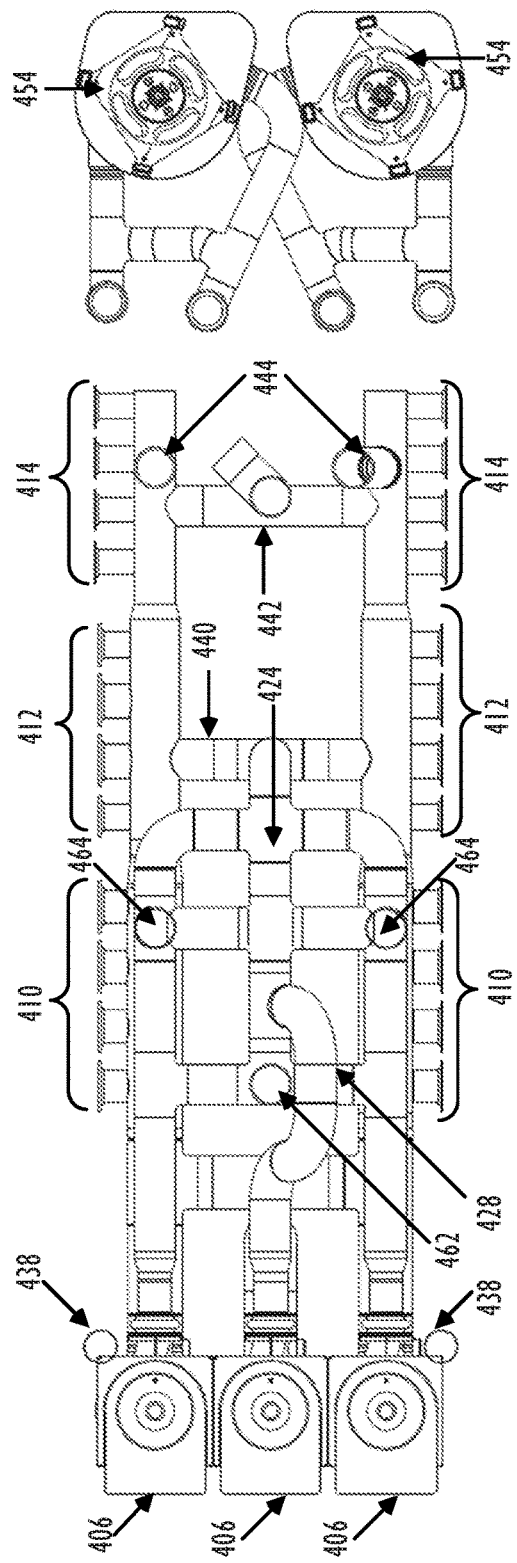
FIG. 4C illustrates a cross sectional view of the hydration-blender transport that depicts the inside of the hydration tank.

FIG. 4C illustrates a cross sectional view of the hydration-blender transport 400 that depicts the inside of the hydration tank 402. As shown in FIG. 4C, the inside of the hydration tank 402 includes the interconnector manifold system 424 that allows the pumps, driven by electric prime movers 406, to direct fluid to different sections of the internal manifold system. In particular, the interconnector manifold system 424 connects to the hydration tank manifold system 416 via connection points 462 and 438 and connects to the hydration-blender manifold system 418 via connection point 464. Using the interconnector manifold system 424, the pumps are able to direct source fluid received at one or more manifold groups 410, 412, and 414 to the hydration tank via the hydration tank manifold system 416 and/or pump hydrated fluid to the blending tubs 454 via the hydration-blender manifold system 418.

Figure 4D:
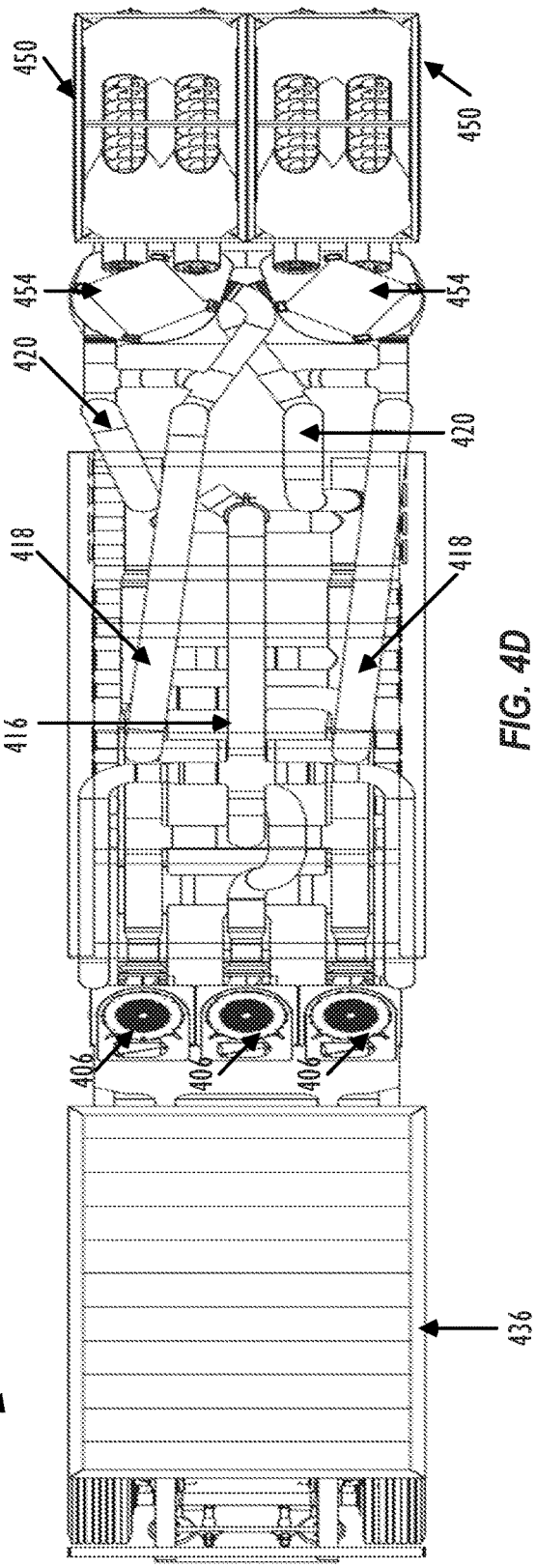
FIG. 4D illustrates a top view the hydration-blender transport that depicts the top of the hydration tank.

FIG. 4D illustrates a top view of the hydration-blender transport 400 that depicts the top of the hydration tank 402. In FIG. 4D, the hydration tank manifold system 416 receives source fluid and directs that source fluid to a diffuser located at the top of the hydration tank 402. The diffuser combines the source fluid with the polymer-based slurry and feeds the hydrated fluid to a tortuous flow path within the hydration tank 402. Once the hydrated fluid travels through the tortuous flow path, the hydration-blender manifold system 418 obtains the hydrated fluid via the interconnector manifold system 424 and supplies the hydrated fluid to the blending tubs 454. In one embodiment, the hydration-blender manifold system 418 includes two different manifold connections, where each manifold connection supplies hydrated fluid to one of the blending tubs 454. Afterwards, the blending tub discharges the fracturing fluid via the blender output manifold system 420.

Figure 4E:
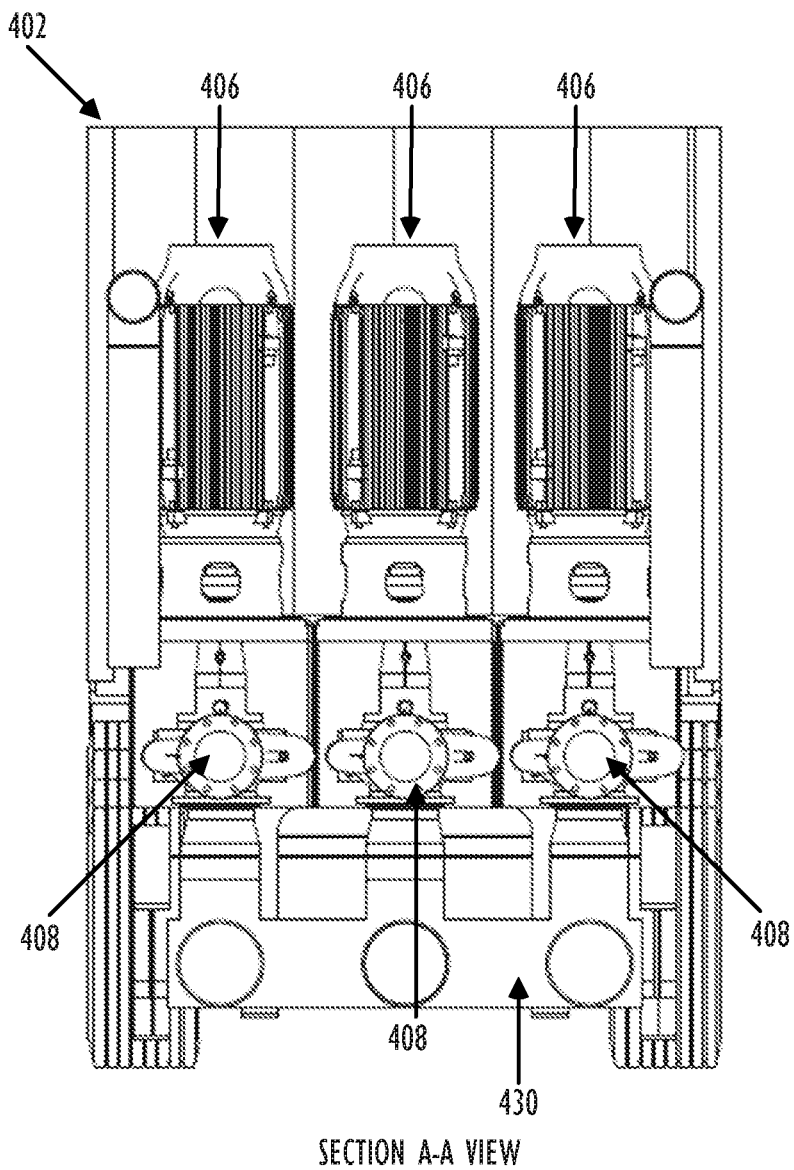
FIG. 4E illustrates a cross sectional view of the hydration-blender transport that corresponds to section cut A-A shown in FIG. 4D.

FIG. 4E illustrates a cross sectional view of the hydration-blender transport 400 that corresponds to section cut A-A shown in FIG. 4D. In FIG. 4E, the electric prime mover 406 and pump 408 combination is mounted in an upright position such that the electric prime mover 406 is mounted on top of the pump 408. The pumps 408 are also connected to the under tank manifold system 430. Three different electric prime mover 406 and pump 408 combinations may be used to provide enough power to simultaneously pump source fluid into the hydration-blender transport 400, pump hydrated fluid into the blending tubs 454, and/or pump fluid out of the hydration-blender transport 400. In one embodiment, the pumps 408 may be centrifugal pumps.

Figure 4F:
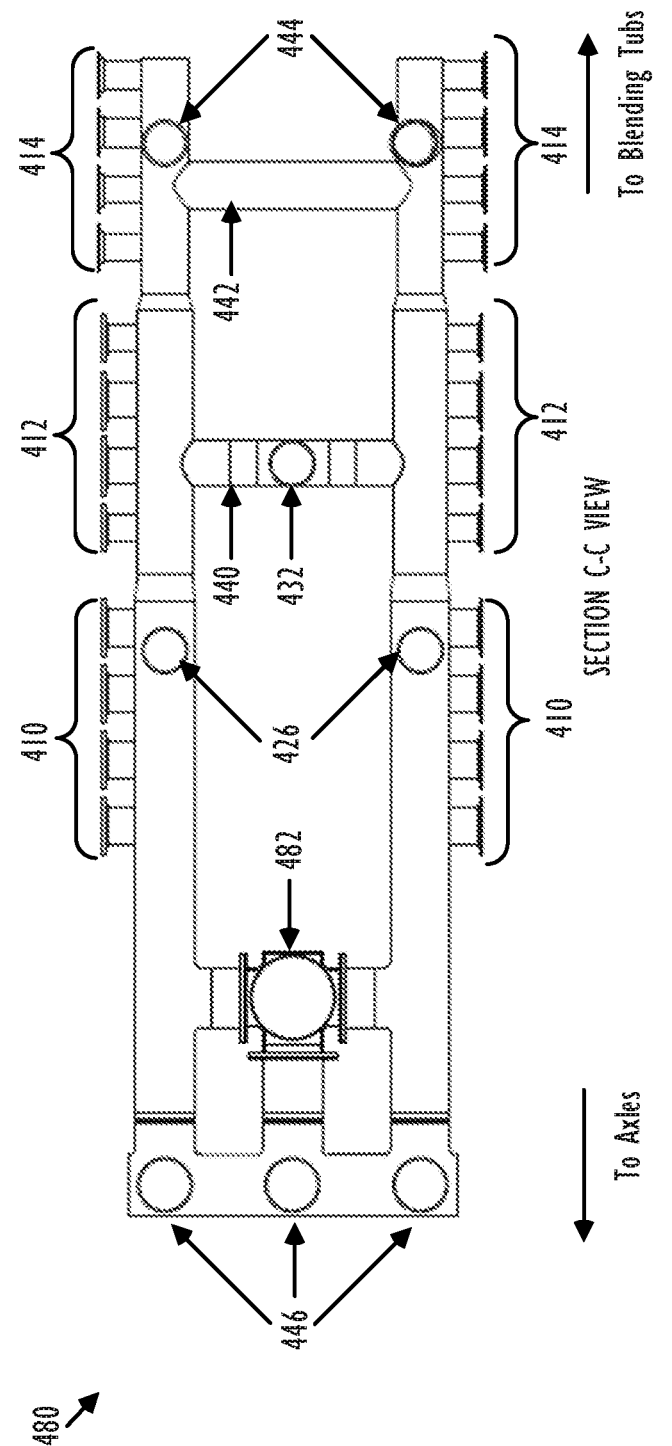
FIG. 4F illustrates an under tank cross sectional view of another embodiment of a hydration-blender transport.

FIG. 4F illustrates an under tank cross sectional view of another embodiment of a hydration-blender transport 400. Specifically, FIG. 4F represents the C-C cross sectional view illustration of an under tank manifold system 480 that is substantially similar to the under tank manifold system 430 shown in FIG. 4B. The under tank manifold system 480 is similar to the under tank manifold system 430 except that the under tank manifold system 480 includes a sump 482 for collecting and remove fluid from the hydration tank 402. As an example, when an operator completes a fracturing job, the operator may empty fluid stored within the hydration tank 402 before transportation. An operator is able to divert stored fluid within the hydration tank 402 to the sump 482 when discharging fluid out of the hydration tank 402.

Figure 5:
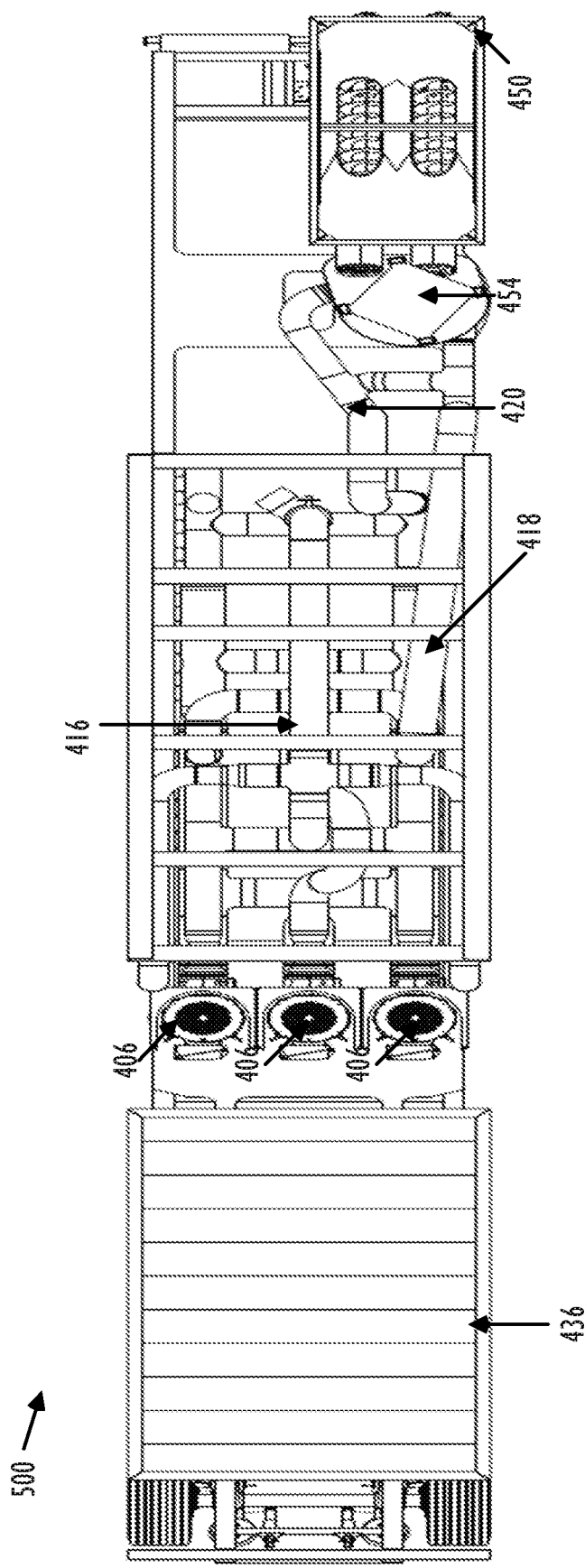
FIG. 5 illustrate an embodiment of a hydration-blender transport that includes a single blending tub.

FIG. 5 illustrates an embodiment of a hydration-blender transport 500 that includes a single blending tub. FIG. 5 illustrates a top view of the hydration-blender transport 500 that depicts the top of the hydration tank. FIG. 5 is similar to FIG. 4D except that manifolds within the hydration-blender manifold system 418 and blender output manifold system 420 that correspond to the missing blending tub have been removed. For example, in FIG. 4D, once the hydrated fluid travels through the tortuous flow path, the hydration-blender manifold system 418 supplies the hydrated fluid to only one blending tub 454. The hydration-blender manifold system 418 includes only one manifold connection to supply hydrated fluid to the one blending tubs 454. Afterwards, the blending tub 454 discharges the fracturing fluid via the blender output manifold system 420 (e.g., using a pump not shown in FIG. 5), which only has one outlet manifold connection to the blending tub 454. Although FIG. 5 illustrates that three electric prime movers 406 may be used to drive three pumps 408, other embodiments of the hydration-blender transport 500 could include two electric prime movers 406 that drive two pumps 408.

Figure 6:
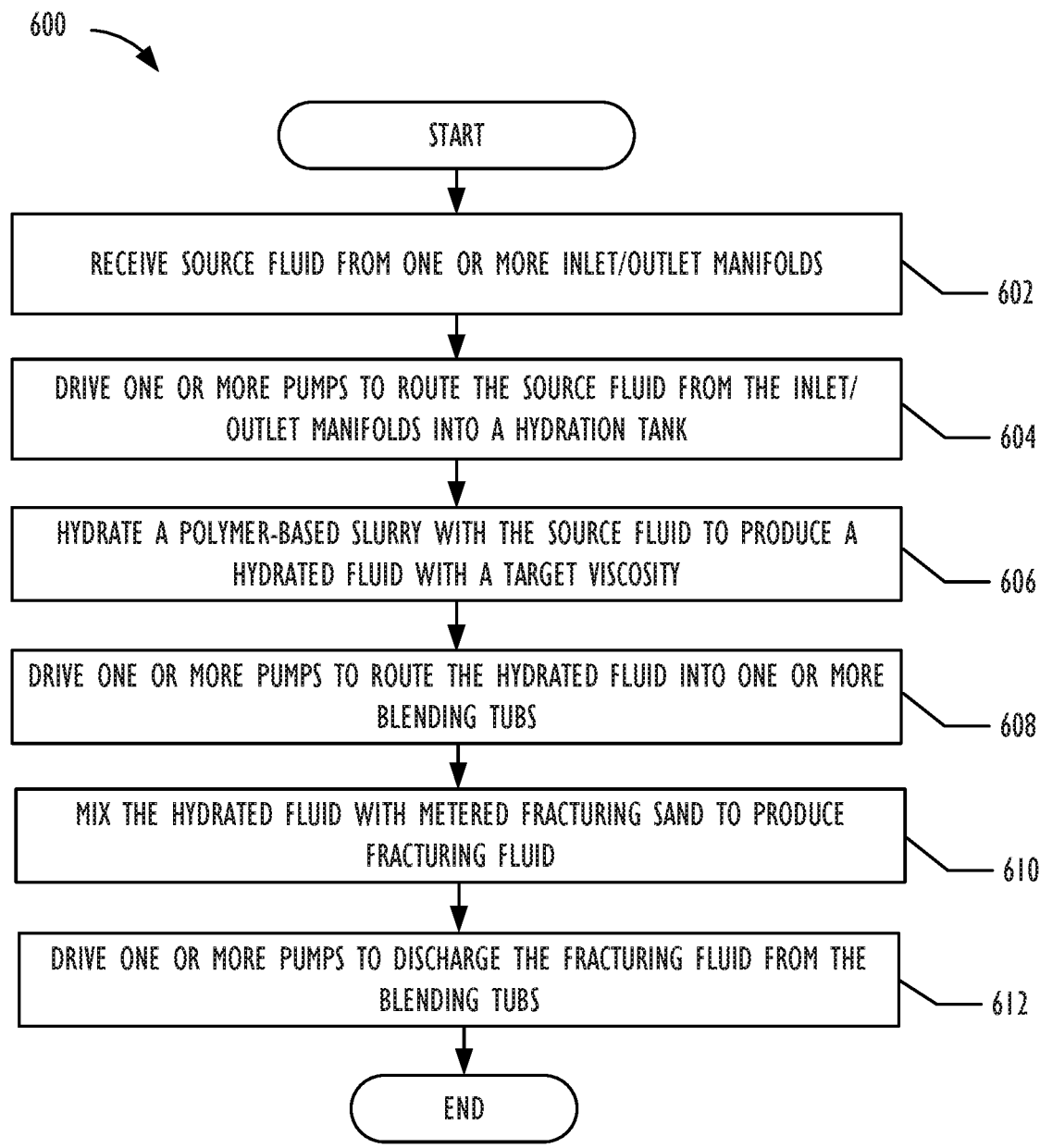
FIG. 6 is a flow chart of an embodiment of a method to provide fracturing fluid using a single hydration-blender transport.

FIG. 6 is a flow chart of an embodiment of a method 600 to provide fracturing fluid using a single hydration-blender transport. Method 600 may correspond to the hydration-blender operation mode and the split-stream operation mode. The use and discussion of FIG. 6 is only an example to facilitate explanation and is not intended to limit the disclosure to this specific example. For example, although FIG. 6 illustrates that the blocks within method 600 are implemented in a sequential order, method 600 is not limited to this sequential order. For instance, one or more of the blocks, such as blocks 604 and 606, could be implemented in parallel.

Method 600 may start at block 602 by receiving source fluid from one or more inlet/outlet manifolds. To implement block 602, method 600 may configure one or more values within the hydration-blender transport such that some of the inlet/outlet manifolds are configured to receive source fluid and some of the of inlet/outlet manifolds discharge fracturing fluid. Method 600 may then move to block 604 and drive one or more pumps to route the source fluid from the inlet/outlet manifolds into a hydration tank. In one embodiment, method 600 may use electric prime movers to drive pumps to route the source fluid.

Method 600 continues to block 606 and hydrates a polymer-based slurry with the source fluid to produce hydrated fluid with a target viscosity. In one embodiment, method 600 may utilize a tortuous flow path that provides enough residence time and a flow rate to supply fracturing fluid to a blender unit. Afterwards, method 600 moves to block 608 and drives one or more pumps to route the hydrated fluid into one or more blending tubs. Method 600 then moves to block 610 and mixes the hydrated fluid with metered fracturing sand to produce fracturing fluid. Afterwards, method 600 continues to block 612 and drives one or more pumps to discharge the fracturing fluid from the blending tubs. Prior to discharging the fracturing fluid, method 600 may configure one or more valves to direct which inlet/outlet manifolds receive the fracturing fluid.

Figure 7:
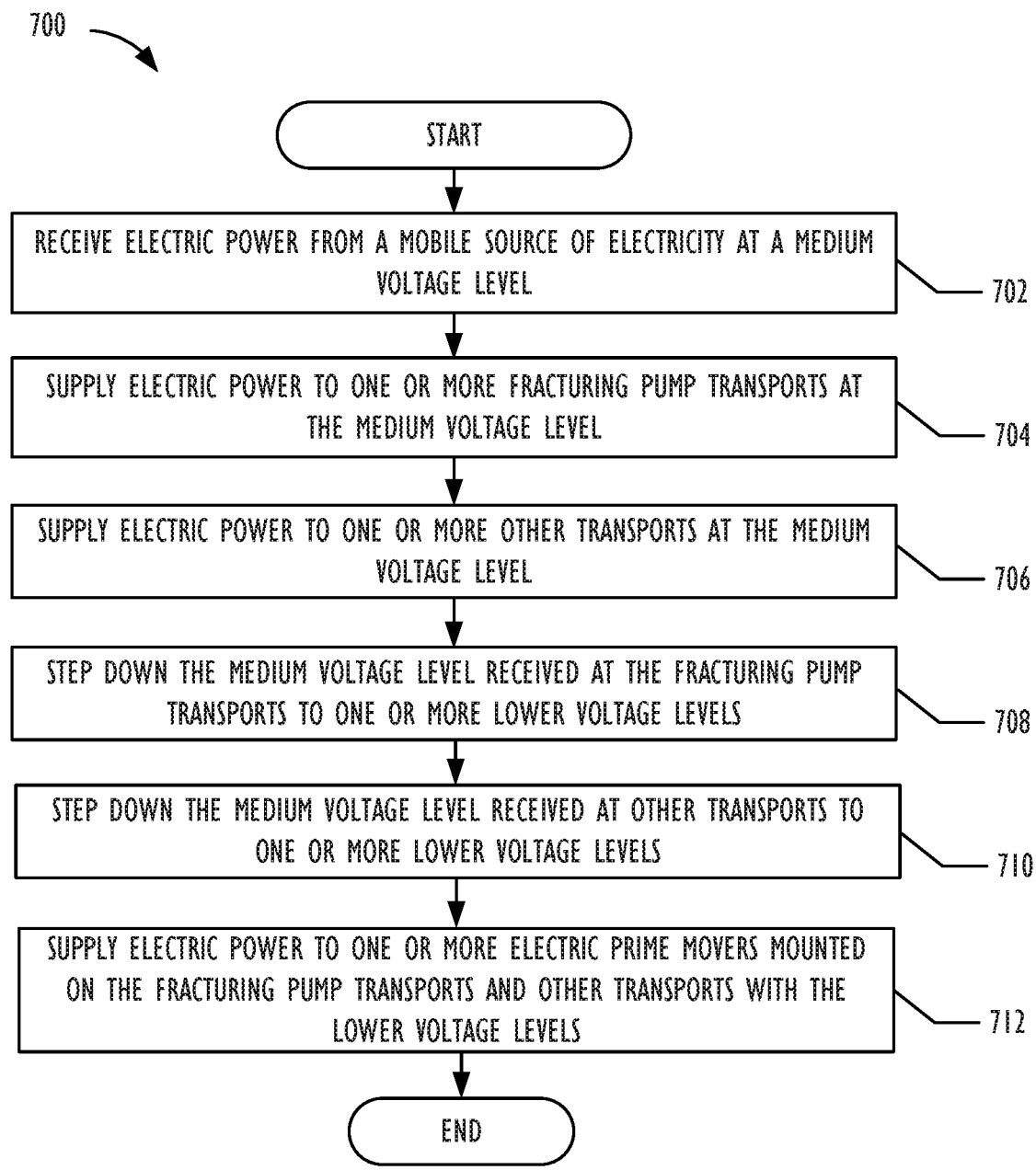
FIG. 7 is a flow chart of an embodiment of a method to provide electric power to fracturing equipment.

FIG. 7 is a flow chart of an embodiment of a method 700 to supply electric power to fracturing equipment using a medium voltage power distribution system. For example the medium voltage power distribution system that includes the switch gear transport 308 and transformers 310 and 312 shown in FIG. 3 can implement method 700. The use and discussion of FIG. 7 is only an example to facilitate explanation and is not intended to limit the disclosure to this specific example. For example, although FIG. 7 illustrates that the blocks within method 700 are implemented in a sequential order, method 700 is not limited to this sequential order. For instance, one or more of the blocks, such as blocks 704 and 706, could be implemented in parallel.

Method 700 may start at block 702 by receiving electric power from a mobile source of electricity at a medium voltage level. As an example, method 700 receives electric power at 13.8 kV or at some other relatively higher medium voltage level from the mobile source of electricity. In one or more other embodiments, method 700 may receive electric power from other power sources, such as a power grid or a power plant. Method 700 may then move to block 704 and supply electric power to one or more fracturing pump transports at the medium voltage level (e.g., 13.8 kV). At block 704, method 700 does not step down the electric power received from the mobile source of electricity to a lower voltage level using transformers. Instead, method 700 at block 706 supplies electric power to one or more transports at the medium voltage level. As discussed with reference to FIG. 3, method 700 is able to reduce the number of electrical cables used to supply electric power to transports, such as fracturing pump transport 304 and hydration-blender transport 306, when compared to the medium-low power distribution system shown in FIG. 2.

Method 700 continues to block 708 and steps down the medium voltage level received at the fracturing pump transports to one or more lower voltage levels. In one embodiment, method 700 may step down the voltage level to a lower medium voltage level (e.g., 4.2 kV) or a low voltage level (e.g., 600 V or 480 V). By stepping the voltage down at the fracturing pump transport, method 700 is able to reduce the number of transports by eliminating the drive power transports (e.g., drive power transports 104 in FIG. 2). Afterwards, method 700 moves to block 710 and steps down the medium voltage level received at other transports to one or more lower voltage levels. For example, method 700 can step down the voltage at a hydration transport, a blender transport, a hydration-blender transport, or combinations thereof. Stepping down the voltage at the different transports also reduces the number of transports by eliminating the auxiliary unit transport. Subsequently, method 700 may move to block 712 and supply electric power to one or more electric prime movers mounted on the fracturing pump transports and other transports with the lower voltage levels.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means ±10% of the subsequent number, unless otherwise stated.

Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. An electric fracturing system for use with at least one power generation source providing source electric power, the system comprising:
   a switch gear transport electrically connected to the at least one power generation source-and configured to receive the source electric power at a first voltage level;
   a first electrical cable connected to the switch gear transport and configured to supply first electric power at the first voltage level from the switch gear transport; and
   a first transport comprising: at least one first transformer, at least one first drive, and at least one first electric prime mover, each being disposed on the first transport,
   wherein the at least one first transformer is electrically connected to the switch gear transport via only the first electrical cable, wherein the at least one first transformer is further electrically connected to the at least one first drive and to the at least one first electric prime mover,
   wherein the at least one first transformer is configured to step down the first electric power received at the first voltage level to a second voltage level that powers the at least one first drive, the second voltage level being less than the first voltage level, and
   wherein the at least one first drive is coupled to the at least one first electric prime mover.

2. The system of claim 1, wherein the first voltage level falls within a range of 1000 volts to 35 kilovolts.

3. The system of claim 2, wherein the first voltage level is set to be at 13.8 kilovolts.

4. The system of claim 1, wherein the second voltage level falls within a range of 50 volts to 1000 volts.

5. The system of claim 1, wherein the first transport is a blender-hydration transport that is electrically connected to the switch gear transport via the first electrical cable and without having a trailer connected in between the switch gear transport and the blender-hydration transport,
   wherein the blender-hydration transport comprises a hydration tank and at least one blending tub mounted on a single transport frame, and
   wherein the second voltage level further powers the at least one first electric prime mover.

6. The system of claim 1, wherein the first transport is a blender transport that is electrically connected to the switch gear transport via the first electrical cable and without having a trailer connected in between the switch gear transport and the blender transport,
   wherein the blender transport comprises at least one blending tub mounted on a blender transport frame, and
   wherein the second voltage level further powers the at least one first electric prime mover.

7. The system of claim 6, further comprising:
   a second electrical cable connected to the switch gear transport and configured to supply second electric power at the first voltage level from the switch gear transport; and
   a hydration transport electrically connected to the switch gear transport via the second electrical cable and without having a transport connected in between the switch gear transport and the hydration transport,
   wherein the hydration transport comprises a hydration tank mounted on a hydration transport frame.

8. The system of claim 7, wherein the hydration transport further comprises: a second transformer, at least one second drive, and at least one second electric prime mover, each being disposed on the hydration transport,
   wherein the second transformer is electrically connected to the switch gear transport via only the second electrical cable, wherein the second transformer is further electrically connected to the at least one second drive and to the at least one second electric prime mover disposed on the hydration transport,
wherein the second transformer is configured to step down the second electric power received at the first voltage level to a third voltage level that powers the at least one second drive disposed on the hydration transport, the third voltage level being less than the first voltage level, and wherein the at least one second drive is coupled to the at least one second electric prime mover disposed on the hydration transport.

9. The system of claim 1, wherein the first transport is a first fracturing pump transport that is electrically connected to the switch gear transport via the first electrical cable and without having a trailer connected in between the switch gear transport and the first fracturing pump transport,
wherein the first fracturing pump transport further comprises at least one pump which is disposed on the first fracturing pump transport,
wherein the at least one first transformer is further configured to step down the first electric power received at the first voltage level to an intermediate voltage level that powers the at least one first electric prime mover, wherein the intermediate voltage level is lower than the first voltage level and is higher than the second voltage level, and
wherein each of the at least one first drive and the at least one pump is coupled to the at least one first electric prime mover.

10. The system of claim 1, wherein the switch gear transport comprises a third transformer electrically connected to an auxiliary source of power providing third electric power at the first voltage level, wherein the third transformer is configured to step down the first voltage level to a third voltage level that falls within a range of 50 volts to 1000 volts.

11. The system of claim 10, further comprising a third electrical cable disposed in electrical communication with the third transformer and configured to supply electric power at the third voltage level from the switch gear transport,
wherein the third voltage level is at a voltage for igniting and starting the at least one power generation source.

12. The system of claim 1, wherein the first electrical cable comprises fiber optic wires configured to communicate between the switch gear transport and the first transport.

13. A transport used with a switch gear for fracturing operations, the switch gear being remote from the transport and providing electric power to the transport via a cable, the transport comprising:
a transport frame;
an electric prime mover mounted on the transport frame;
a drive mounted on the transport frame and coupled to the electric prime mover;
an electrical connection disposed on the transport frame and configured to connect to the cable of the switch gear; and
at least one transformer coupled through the drive to the electric prime mover and mounted on the transport frame, the at least one transformer being in electrical communication with the electrical connection and being configured to: receive the electric power at a first voltage level from the switch gear via the cable, step down the electric power at the first voltage level to at least one second voltage level less than the first voltage level, and supply the electric power at the at least one second voltage level to the drive and to the electric prime mover.

14. The transport of claim 13, further comprising a blending tub mounted on the transport frame and being operable with the electric prime mover.

15. The transport of claim 14, further comprising a hydration tank mounted on the transport frame and disposed in fluid communication with the blending tub.

16. The transport of claim 13, further comprising a pump mounted on the transport frame and coupled to the electric prime mover, the at least one transformer being configured to step down the electric power received at the first voltage level to an intermediate one and to a low one of the at least one second voltage level, the at least one transformer configured to supply the electric power at the low voltage level to the drive, the at least one transformer configured to supply the electric power at the intermediate voltage level through the drive to the electric prime mover to drive the pump.

17. The transport of claim 16, wherein the first voltage level is at a 13.8 kilovolt level, the low voltage level falls within a range of 50 volts to 1000 volts, the intermediate voltage level is at a voltage in a range from the low voltage level to less than the first voltage level.

18. The transport of claim 16, wherein the at least one transformer comprises one of:
a single transformer configured to step down the first voltage level to the intermediate voltage level and the low voltage level; and
a first transformer configured to step down to the intermediate voltage level and a second transformer configured to step down to the low voltage level.

* * * * *